ID2 United States Patent (10) Patent No.: US 11,438,536 B2
Yanagida et al. (45) Date of Patent: *Sep. 6, 2022

(54) IMAGING DEVICE INCLUDING LINES FOR EACH COLUMN

(71) Applicant: Panasonic Intellectual Property Management Co., Ltd., Osaka (JP)

(72) Inventors: Masaaki Yanagida, Osaka (JP); Masashi Murakami, Kyoto (JP); Sanshiro Shishido, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/224,912

(22) Filed: Jul. 7, 2022

(65) Prior Publication Data

US 2021/0227157 A1 Jul. 22, 2021

Related U.S. Application Data

(63) Continuation of application No. 16/250,264, filed on Jan. 17, 2019, now Pat. No. 10,999,542, which is a
(Continued)

(30) Foreign Application Priority Data

Jan. 22, 2016 (JP) ................ 2016-010444

(51) Int. Cl.
H04N 5/363 (2011.01)
H04N 5/378 (2011.01)
H01L 27/30 (2006.01)

(52) U.S. Cl.
CPC ........... H04N 5/363 (2013.01); H01L 27/307 (2013.01); H04N 5/378 (2013.01)

(58) Field of Classification Search
None
See application file for complete search history.

(56) References Cited

U.S. PATENT DOCUMENTS 7,565,033 B2 7/2009 Hanson
7,880,786 B2 2/2011 Muramatsu
(Continued)

FOREIGN PATENT DOCUMENTS

JP 2008-268155 A 11/2008
JP 2010-206653 A 9/2010
(Continued)

OTHER PUBLICATIONS

JP 62-38082 B2; Solid-State Imaging Device; Nov. 2017; Panasonic Intellectual Property Management Co., Ltd; Abstract; English Translation.
(Continued)

Primary Examiner — Cynthia Segura
(74) Attorney, Agent, or Firm — McDermott Will & Emery LLP

(57) ABSTRACT

An imaging device that includes pixels arranged in a matrix having rows and columns, the pixels including first pixels and second pixels different from the first pixels, the first pixels and the second pixels being located in one of the columns, each of the pixels including a photoelectric converter that converts incident light into signal charge, and a first transistor having a first gate, a first source and a first drain, the first gate being coupled to the photoelectric converter. The imaging device further includes a first line coupled to one of the first source and drain of the first pixels; a second line coupled to one of the first source and drain of the second pixels; a third line coupled to the other of the first
(Continued)

source and drain of the first pixels; and voltage circuitry coupled to the third line and that supplies a first and second voltage.

24 Claims, 27 Drawing Sheets

Related U.S. Application Data continuation of application No. 15/407,084, filed on Jan. 16, 2017, now Pat. No. 10,225,500.

(56) References Cited

U.S. PATENT DOCUMENTS

| | | | |
|---|---|---|---|
| 8,054,358 | B2 | 11/2011 | Sawada et al. |
| 8,324,548 | B2 | 12/2012 | Mo et al. |
| 8,400,544 | B2 * | 3/2013 | Abe .................. H04N 5/378 348/308 |
| 8,532,040 | B2 | 9/2013 | Kwon et al. |
| 8,618,459 | B2 | 12/2013 | Hynecek et al. |
| 8,854,283 | B2 | 10/2014 | Yamamoto et al. |
| 9,319,609 | B2 | 4/2016 | Kasuga et al. |
| 9,479,719 | B2 | 10/2016 | Yoo |
| 9,972,656 | B2 | 5/2018 | Cieslinski |
| 10,325,945 | B2 | 6/2019 | Murakami |
| 2005/0237408 | A1 | 10/2005 | Muramatsu |
| 2008/0258042 | A1 | 10/2008 | Krymski |
| 2011/0199106 | A1 | 8/2011 | Lotto et al. |
| 2011/0204246 | A1 * | 8/2011 | Tanaka .................. G01T 1/2018 250/370.08 |
| 2011/0205408 | A1 | 8/2011 | Suzuki |
| 2013/0107094 | A1 | 5/2013 | Yamamoto et al. |
| 2013/0146749 | A1 * | 6/2013 | Cieslinski ............ H01L 27/148 250/208.1 |
| 2014/0160334 | A1 | 6/2014 | Wakabayashi |
| 2015/0077609 | A1 * | 3/2015 | Okamoto ............ H04N 5/3742 348/303 |
| 2015/0103219 | A1 * | 4/2015 | Kasuga ................ H04N 5/3745 348/300 |
| 2015/0172573 | A1 | 6/2015 | Wang et al. |
| 2015/0189210 | A1 | 7/2015 | Shimizu |
| 2015/0237247 | A1 | 8/2015 | Hara |
| 2015/0288898 | A1 | 10/2015 | Yazawa |
| 2015/0288903 | A1 | 10/2015 | Oshima |
| 2016/0028974 | A1 | 1/2016 | Guidash et al. |
| 2016/0190187 | A1 | 6/2016 | Nishimura et al. |
| 2016/0190188 | A1 | 6/2016 | Murakami et al. |
| 2016/0360131 | A1 * | 12/2016 | Shimasaki ......... H04N 5/37457 |
| 2017/0006238 | A1 | 1/2017 | Kenzaburo |
| 2017/0013221 | A1 | 1/2017 | Yanagida et al. |
| 2017/0201702 | A1 | 7/2017 | Niwa et al. |
| 2017/0214871 | A1 | 7/2017 | Kanehara et al. |
| 2017/0214873 | A1 | 7/2017 | Nishimura et al. |
| 2017/0244918 | A1 | 8/2017 | Sakuragi |
| 2017/0328776 | A1 | 11/2017 | Shimasaki et al. |
| 2018/0114926 | A1 | 4/2018 | Ujiie |
| 2018/0205896 | A1 | 7/2018 | Nishimura et al. |
| 2018/0227526 | A1 | 8/2018 | Tokuhara et al. |
| 2019/0259793 | A1 | 8/2019 | Murakami |
| 2020/0366860 | A1 * | 11/2020 | Shishido ............... H04N 5/379 |

FOREIGN PATENT DOCUMENTS

| | | |
|---|---|---|
| JP | 2011-228621 A | 11/2011 |
| JP | 2012-019167 A | 1/2012 |
| JP | 2014-216978 A | 11/2014 |
| JP | 104412574 A | 3/2015 |
| JP | 2015-128253 A | 7/2015 |
| JP | 3238082 B2 | 11/2017 |
| WO | 2011/125677 A1 | 10/2011 |
| WO | 2014002333 A1 | 1/2014 |
| WO | WO-2014002333 A1 * | 1/2014 ............. H04N 5/363 |

OTHER PUBLICATIONS

English Translation of Chinese Search Report dated Mar. 10, 2020 for the related Chinese Patent Application No. 201611035857.2.
Non-Final Office Action dated Mar. 6, 2020 in U.S. Appl. No. 16/250,264.
Non-Final Office Action dated Aug. 11, 2020 in U.S. Appl. No. 16/250,264.
Notice of Allowance dated Jan. 8, 2021 in U.S. Appl. No. 16/250,264.

* cited by examiner

IMAGING DEVICE INCLUDING LINES FOR EACH COLUMN

CROSS REFERENCE

This application is a Continuation of U.S. patent application Ser. No. 16/250,264 filed Jan. 17, 2019, which is a Continuation of U.S. patent application Ser. No. 15/407,084 filed on Jan. 16, 2017, now U.S. Pat. No. 10,225,500, which claims the benefit of Japanese Application No. 2016-010444 filed on Jan. 22, 2016, the entire contents of each are hereby incorporated by reference.

BACKGROUND

1. Technical Field

The present disclosure relates to an imaging device.

2. Description of the Related Art

Charge-coupled device (CCD) image sensors and complementary metal-oxide-semiconductor (CMOS) image sensors are being used widely in devices such as digital cameras. As is well known, these image sensors include photodiodes formed on a semiconductor substrate. Otherwise, a structure is known in which photoelectric converters including a photoelectric conversion layer are arranged above a semiconductor substrate. For example, Japanese Unexamined Patent Application Publication No. 2011-228621 discloses a solid-state image sensor element in which photoelectric converter elements P including a photoelectric conversion layer are arranged on top of an insulating layer 20 covering a semiconductor substrate 10 on which a signal readout circuit 11 is formed (see FIG. 2). With a so-called laminated structure like the above, the photoelectric converters are arranged above the signal readout circuit, and thus the aperture ratio is easily maintained. Consequently, such a structure has the advantage of enabling higher pixel densities.

In the field of imaging devices, there is demand for noise reduction. In particular, there is demand to reduce the kTC noise produced when resetting the electric charge generated by photoelectric conversion (also called "reset noise"). U.S. Pat. No. 6,532,040 proposes the cancellation of reset noise by providing a feedback amplifier on each pixel column in the imaging area, and forming a feedback path that includes the feedback amplifiers. The entire contents of U.S. Pat. No. 6,532,040 are incorporated by reference herein.

SUMMARY

Reset noise cancellation by the formation of a feedback path as proposed in U.S. Pat. No. 6,532,040 requires a long time compared to signal readout. For this reason, achieving both reset noise cancellation by the formation of a feedback path and frame rate improvement is difficult in general.

In one general aspect, the techniques disclosed here feature an imaging device that includes pixels arranged in a matrix having rows and columns, the pixels including first pixels and second pixels different from the first pixels, the first pixels and the second pixels being located in one of the columns, each of the pixels comprising: a photoelectric converter that converts incident light into signal charge, and a first transistor having a first gate, a first source and a first drain, the first gate being coupled to the photoelectric converter. The imaging device further including a first line coupled to one of the first source and the first drain of each of the first pixels; a second line coupled to one of the first source and the first drain of each of the second pixels, the second line being different from the first line; a third line coupled to the other of the first source and the first drain of each of the first pixels; and voltage circuitry that is coupled to the third line and that supplies a first voltage and a second voltage different from the first voltage, wherein the first pixels are arranged every n rows in the one of the columns, and the second pixels are arranged every n rows in the one of the columns, where n is an integer equal to or greater than two, the rows respectively having the first pixels being different from those respectively having the second pixels.

It should be noted that general or specific embodiments may be implemented as an element, a device, a module, a system, an integrated circuit, a method, a computer program, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
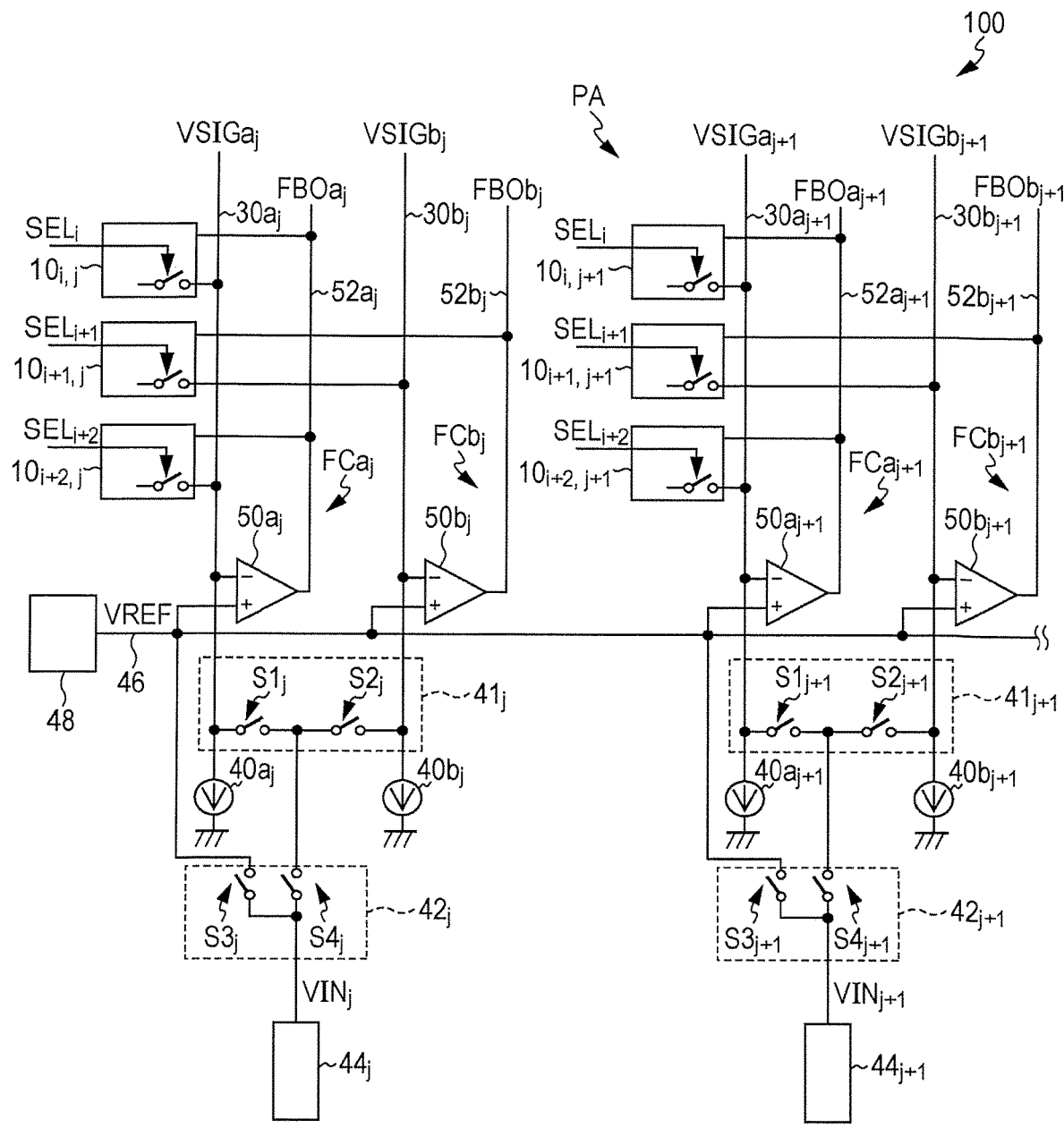
FIG. 1 is a diagram illustrating an overview of an exemplary circuit configuration of an imaging device according to a first embodiment of the present disclosure.

An overview of aspects of the present disclosure is given below.

[Item 1]

An imaging device, comprising:
pixel cells arranged in a matrix having rows and columns, each of the pixel cells comprising a photoelectric converter and a signal detection circuit that detects an electrical signal generated in the photoelectric converter and outputs an output signal, the pixel cells including first pixel cells and second pixel cells located in one of the columns;
a first output signal line through which the output signal is output from each of the first pixel cells;
a second output signal line through which the output signal is output from each of the second pixel cells;
a first feedback circuit that forms, for each of the first pixel cells, a first feedback path that negatively feeds back the electrical signal; and
a second feedback circuit that forms, for each of the second pixel cells, a second feedback path that negatively feeds back the electrical signal, wherein
The first pixel cells are arranged every n rows in the one of the columns, and the second pixel cells are arranged every n rows in the one of the columns, where n is an integer equal to or greater than two, the rows respectively having the first pixel cells being different from those respectively having the second pixel cells.

According to the configuration of Item 1, while conducting the readout of a signal from one pixel cell, a feedback path may be formed for another pixel cell belonging to the same column.

[Item 2]

The imaging device according to Item 1, wherein
the photoelectric converter comprises a pixel electrode, an counter electrode, and a photoelectric conversion layer located between the pixel electrode and the counter electrode,
the signal detection circuit comprises a signal detection transistor having a gate electrically connected to the pixel electrode,
the first feedback circuit includes, in each of the first pixel cells, the signal detection transistor as a part of the first feedback path, and
the second feedback circuit includes, in each of the second pixel cells, the signal detection transistor as a part of the second feedback path.

According to the configuration of Item 2, the output of a signal detection transistor may be fed back.

[Item 3]

The imaging device according to Item 2, wherein
the signal detection circuit comprises a feedback transistor one of a source and a drain of which is electrically connected to the pixel electrode,
the first feedback circuit negatively feeds back, for each of the first pixel cells, an output of the signal detection transistor to the other of the source and the drain of the feedback transistor, and
the second feedback circuit negatively feeds back, for each of the second pixel cells, an output of the signal detection transistor to the other of the source and the drain of the feedback transistor.

According to the configuration of Item 3, band limiting using a feedback transistor may be executed.

[Item 4]

The imaging device according to Item 1, wherein
the first feedback circuit comprises a first inverting amplifier,
the second feedback circuit comprises a second inverting amplifier,
the first feedback circuit includes a part of the first output signal line and the first inverting amplifier as a part of the first feedback path, and
the second feedback circuit includes a part of the second output signal line and the second inverting amplifier as a part of the second feedback path.

[Item 5]

The imaging device according to Item 4, further comprising:

a reference-signal generator that generates a reference signal to be supplied to an input terminal of the first inverting amplifier and an input terminal of the second inverting amplifier, wherein the reference-signal generator is located outside a region in which the pixel cells are arranged in the matrix.

According to the configuration of Item 5, the reference-signal generator is arranged outside the pixel array, and thus has the advantage of enabling higher pixel densities.

[Item 6]

The imaging device according to Item 5, further comprising:

a column circuit electrically connected to the first output signal line and the second output signal line to receive the output signal from each of the first and second pixel cells, and electrically connected to the reference-signal generator to receive the reference signal for processing the output signal.

According to the configuration of Item 6, a noise silencing process using a reference signal as a dark level may be executed.

Hereinafter, exemplary embodiments of the present disclosure will be described in detail and with reference to the drawings. Note that the exemplary embodiments described hereinafter all illustrate general or specific examples. Features such as numerical values, shapes, materials, structural elements, arrangements and connection states of structural elements, steps, and the ordering of steps indicated in the following exemplary embodiments are merely examples, and are not intended to limit the present disclosure. The various aspects described in this specification may also be combined with each other in non-contradictory ways. In addition, among the structural elements in the following exemplary embodiments, structural elements that are not described in the independent claim indicating the broadest concept are described as arbitrary or optional structural elements. In the following description, structural elements having substantially the same functions will be denoted by shared reference signs, and the description of such structural elements may be reduced or omitted.

First Embodiment

FIG. 1 illustrates an overview of an exemplary circuit configuration of an imaging device according to a first embodiment of the present disclosure. The imaging device 100 illustrated in FIG. 1 includes a pixel array PA including multiple pixel cells 10, and peripheral circuits. The multiple pixel cells 10 constituting the pixel array PA are arrayed in a matrix having multiple rows and multiple columns.

The number of pixel cells 10 in the pixel array PA may be approximately from several million to several tens of millions, for example. In FIG. 1, to keep the diagram from becoming overly complex, a group of two pixel cells 10 in the row direction and three in the column direction, for a total of six, are illustrated as a representative example. In this specification, the row direction and the column direction refer to the directions in which the rows and columns extend, respectively. In other words, in the drawings, the up-and-down direction on the page is the column direction, while the left-and-right direction is the row direction. Note that FIG. 1 is merely a diagrammatic illustration of the arrangement of the pixel cells 10, and the multiple pixel cells 10 arranged in the row direction are not required to be arranged strictly in a straight line. For example, between two pixel cells adjacent to each other in the row direction, the center of one pixel cell may be offset from the center of the other pixel cell by approximately half the pixel pitch in the column direction. Similarly, the multiple pixel cells 10 arranged in the column direction are not required to be arranged strictly in a straight line in the column direction.

The multiple pixel cells 10 form an imaging area by being arrayed two-dimensionally on a semiconductor substrate, for example. In the following, certain rows and/or certain columns in the pixel array PA will be denoted with the use of subscripts. For example, the pixel cell 10 positioned on the (i)th row and the (j)th column may be denoted the pixel cell $10_{i,j}$ (where i and j are integers equal to or greater than 1).

In an embodiment of the present disclosure, a pair made up of a first output signal line 30a and a second output signal line 30b is provided for each column of pixel cells 10. For example, for the (j)th column of the pixel array PA, a first output signal line $30a_j$ and a second output signal line $30b_j$ extending in the column direction are disposed, while for the (j+1)th column, a first output signal line $30a_{j+1}$ and a second output signal line $30b_{j+1}$ extending in the column direction are disposed. A constant current source made up of a load transistor and the like is connected to one end of each output signal line. In the illustrated example, constant current sources $40a_j$ and $40b_j$ are connected respectively to one end of the first output signal line $30a_j$ and the second output signal line $30b_j$ of the (j)th column. Constant current sources $40a_{j+1}$ and $40b_{j+1}$ are connected respectively to one end of the first output signal line $30a_{j+1}$ and the second output signal line $30b_{j+1}$ of the (j+1)th column.

Each pixel cell 10 has a connection to one of the first output signal line 30a and the second output signal line 30b. In other words, each column of pixel cells 10 includes one or more pixel cells 10 having a connection to the first output signal line 30a, and one or more pixel cells 10 having a connection to the second output signal line 30b. In this example, among the multiple pixel cells 10 belonging to the (j)th column, the pixel cell $10_{i,j}$ on the (i)th row and the pixel cell $10_{i+2,j}$ on the (i+2)th row are connected to the first output signal line $30a_j$, while the pixel cell $10_{i+1,j}$ on the (i+1)th row is connected to the second output signal line $30b_j$. Also, in this example, among the multiple pixel cells 10 belonging to the (j+1)th column, similarly to the (j)th column, the pixel cell $10_{i,j+1}$ on the (i)th row and the pixel cell $10_{i+2,j+1}$ on the (i+2)th row are connected to the first output signal line $30a_{j+1}$, while the pixel cell $10_{i+1,j+1}$ on the (i+1)th row is connected to the second output signal line $30b_{j+1}$. In other words, in this example, the pixel cells 10 on odd-numbered rows (or even-numbered rows) in the pixel array PA are connected to the first output signal line 30a, while the pixel cells 10 on the even-numbered rows (or odd-numbered rows) are connected to the second output signal line 30b.

As discussed later, each of the pixel cells 10 includes a photoelectric converter, and a signal detection circuit that detects an electrical signal produced by the photoelectric converter. The signal detection circuit of each pixel cell 10 typically includes an address transistor. By switching on the address transistor, the output signal from a desired pixel cell 10 may be read out to the corresponding output signal line.

As illustrated diagrammatically in FIG. 1, switching on and off in the address transistor may be controlled in units of rows by using an address control signal SEL. Typically, the address control signal SEL is supplied from a vertical scan circuit (not illustrated) disposed as a peripheral circuit. By selecting the pixel cells 10 in units of row by using the address control signal SEL, signals may be read out from the pixel cells 10 to the corresponding output signal line in units of rows. Herein, the output of each pixel cell 10 belonging to an odd-numbered row (or even-numbered row) is read out via the first output signal line 30a, while the output of each pixel cell 10 belonging to an even-numbered row (or odd-numbered row) is read out via the second output signal line 30b.

In the configuration illustrated as an example in FIG. 1, the first output signal line 30a and the second output signal line 30b for each column of the pixel cells 10 are connected to a switching circuit 41. As illustrated, the switching circuit 41 is connected between the pair of the first output signal line 30a and the second output signal line 30b, and a column circuit 44 provided in correspondence with each column of the pixel cells 10. In the configuration illustrated as an example herein, a second switching circuit 42 is connected between the switching circuit 41 and the column circuit 44.

The switching circuit 41 includes a first switching element S1 connected to the first output signal line 30a and a second switching element S2 connected to the second output signal line 30b. The first switching element S1 and the second switching element S2 are controlled to operate in a complementary manner. Namely, when the first switching element S1 is on, the second switching element S2 is off, and when the first switching element S1 is off, the second switching element S2 is on. When the first switching element S1 is on, a connection is established between the first output signal line 30a and the second switching circuit 42, and the voltage VSIGa of the first output signal line 30a is input into the switching circuit 42. When the second switching element S2 is on, a connection is established between the second output signal line 30b and the switching circuit 42, and the voltage VSIGb of the second output signal line 30b is input into the switching circuit 42.

The switching circuit 42 includes a third switching element S3 and a fourth switching element S4. The fourth switching element S4 is connected between the column circuit 44 and the switching circuit 41. The third switching element S3 is connected between the column circuit 44, and a reference voltage line 46 to which a reference voltage VREF is applied during operation of the imaging device 100. The first switching element S1, the second switching element S2, the third switching element S3, and the fourth switching element S4 are field-effect transistors (FETs), for example.

The reference voltage line 46 is connected to a voltage supply circuit 48 that supplies the reference voltage VREF. The voltage supply circuit 48 is not limited to a specific power supply circuit. The voltage supply circuit 48 may be a circuit that generates the reference voltage VREF, or a circuit that converts a voltage supplied from another power supply into the reference voltage VREF. As illustrated, disposing the voltage supply circuit 48 that supplies the reference voltage VREF outside the pixel array PA has the advantage of enabling higher pixel densities. The reference voltage VREF is a voltage corresponding to the reset voltage of the pixel cells 10.

The third switching element S3 and the fourth switching element S4 in the switching circuit 42 are controlled to operate in a complementary manner, similarly to the first switching element S1 and the second switching element S2 discussed above. Namely, when the fourth switching element S4 is on, a connection is established between the switching circuit 41 and the column circuit 44, thereby causing one of the voltage VSIGa of the first output signal line 30a and the voltage VSIGb of the second output signal line 30b to be supplied to the column circuit 44 as an input VIN. On the other hand, when the third switching element S3 is on, a connection is established between the reference voltage line 46 and the column circuit 44, and the reference voltage VREF is supplied to the column circuit 44.

The column circuit 44 conducts processing such as noise suppression signal processing as typified by correlated double sampling, and analog-to-digital conversion (AD conversion). In this example, it is possible to supply the reference voltage VREF discussed above to the column circuit 44, and the reference voltage VREF may be utilized in the noise suppression signal processing. The output of the column circuit 44 is supplied to a horizontal signal readout circuit (not illustrated). The horizontal signal readout circuit successively reads out signals from the multiple column circuits 44 to a horizontal common signal line (not illustrated).

The imaging device 100 includes a first feedback circuit FCa and a second feedback circuit FCb. In this example, the first feedback circuit FCa and the second feedback circuit FCb are provided for each column of the pixel cells 10. For example, the first feedback circuit $FCa_j$ on the (j)th column forms a first feedback path that negatively feeds back the electrical signals produced by the photoelectric converters of the pixel cells $1_{p,j}$ (herein, p=i, i+2, i+4, . . . ) connected to the first output signal line $30a_j$. Additionally, the second feedback circuit $FCb_j$ on the (j)th column forms a second feedback path that negatively feeds back the electrical signals produced by the photoelectric converters of the pixel cells $10_{q,j}$ (herein, q=i+1, i+3, i+5, . . . ) connected to the second output signal line $30b_j$. Note that the formation of the first feedback path during operation of the imaging device 100 is not executed simultaneously for all of the pixel cells $10_{p,j}$ connected to the first output signal line $30a_j$, but instead is executed sequentially one by one. Similarly, the formation of the second feedback path during operation of the imaging device 100 is not executed simultaneously for all of the pixel cells $10_{q,j}$ connected to the second output signal line $30b_j$, but instead is executed sequentially one by one.

In the example illustrated in FIG. 1, the first feedback circuit FCa and the second feedback circuit FCb include a first inverting amplifier 50a and a second inverting amplifier 50b, respectively. As illustrated, the first output signal line 30a is connected to the inverting input terminal of the first inverting amplifier 50a. A first feedback line 52a is connected to the output terminal of the first inverting amplifier 50a. The pixel cells 10 having a connection to the first output signal line 30a are connected to the first feedback line 52a. Meanwhile, the inverting input terminal of the second inverting amplifier 50b is connected to the second output signal line 30b. A second feedback line 52b is connected to the output terminal of the second inverting amplifier 50b, and the pixel cells 10 having a connection to the second output signal line 30b are connected to the second feedback line 52b.

Taking the (j)th column as an example, the pixel cell $10_{i,j}$ and the pixel cell $10_{i+2,j}$ having a connection to the first output signal line 30a have a connection to the first feedback line $52a_j$, while the pixel cell $10_{i+1,j}$ having a connection to the second output signal line 30b has a connection to the second feedback line $52b_j$. If the pixel cell $10_{i,j}$ on the (i)th row is selected by the control of the address control signal $SEL_i$, for example, the signal from the pixel cell $10_{i,j}$ is input into the first inverting amplifier $50a_j$ via the first output signal line $30a_j$, and the output $FBOa_j$ of the first inverting amplifier $50a_j$ is fed back into the pixel cell $10_{i,j}$ via the first feedback line $52a_j$. In other words, in this example, the first feedback circuit FCa includes part of the first output signal line 30a and the first inverting amplifier 50a as part of the first feedback path. Similarly, if the pixel cell $10_{i+1,j}$ on the (i+1)th row is selected, for example, the signal from the pixel cell $10_{i+1,j}$ is input into the second inverting amplifier $50b_j$ via the second output signal line $30b_i$, and the output $FBOb_j$ of the second inverting amplifier $50b_j$ is fed back into the pixel cell $10_{i+1,j}$ via the second feedback line $52b_j$. In other words, in this example, the second feedback circuit FCb includes part of the second output signal line $30b$ and the second inverting amplifier $50b$ as part of the second feedback path.

Note that in this example, the non-inverting input terminals of the first inverting amplifier $50a$ and the second inverting amplifier $50b$ are both connected to the reference voltage line 46. Consequently, during the formation of the first feedback path, the voltage of the first output signal line $30a$ converges on the reference voltage VREF. Also, during the formation of the second feedback path, the voltage of the second output signal line $30b$ converges on the reference voltage VREF. As discussed later, in this example, the reference voltage VREF is utilized as a reference voltage for reset. The specific value of the reference voltage VREF may be set to an arbitrary value within the range between the power supply voltage (3.3 V, for example) and ground (0 V).

(First Operational Example in Imaging Device 100)

Figure 2:
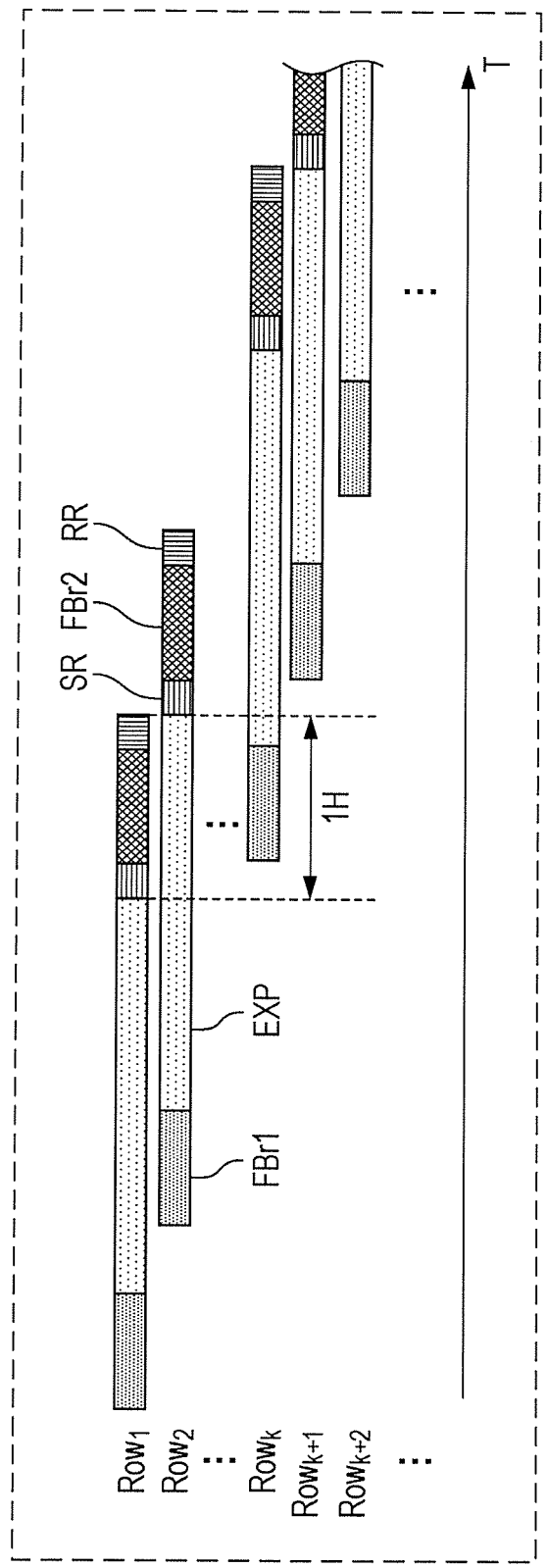
FIG. 2 is a schematic diagram illustrating an example of a driving sequence for multiple pixel cells belonging to a certain column in a pixel array PA.

FIG. 2 is a conceptual diagram illustrating an example of operations in the imaging device 100. The horizontal axis T in FIG. 2 represents time, and FIG. 2 diagrammatically illustrates a driving sequence of multiple pixel cells 10 belonging to a certain column in the pixel array PA. Specifically, $Row_1$, $Row_2$, $Row_k$, $Row_{k+1}$, and $Row_{k+2}$ in FIG. 2 represent the driving sequences for the pixel cells 10 on the 1st row, the 2nd row, the kth row, the (k+1)th row, and the (k+2)th row, respectively. Herein, k is an even number greater than 1.

During image capture, first, a reset is executed for each pixel cell 10. The reset is a process for releasing signal charge remaining in a charge accumulation region for accumulating signal charge to the outside of the charge accumulation region, and setting the electric potential of the charge accumulation region to a certain reset voltage. Typically, a transistor (called a reset transistor) disposed between the charge accumulation region and the supply source of the reset voltage is switched on to electrically connect the two and thereby set the electric potential of the charge accumulation region to a certain reset voltage. After that, the transistor is switched off.

When the reset transistor is off, kTC noise is produced. In the configuration illustrated as an example in FIG. 1, since the imaging device 100 includes the first feedback circuit FCa and the second feedback circuit FCb, it is possible to cancel out the kTC noise through the formation of the first feedback path and the second feedback path. An operational example during noise cancellation utilizing the first feedback circuit FCa and the second feedback circuit FCb will be discussed later in detail.

In the circuit configuration described with reference to FIG. 1, the first feedback circuit FCa and the second feedback circuit FCb respectively include the first inverting amplifier $50a$ and the second inverting amplifier $50b$, in both of which the non-inverting input terminal is connected to the reference voltage line 46. For this reason, the formation of the first feedback path and the second feedback path causes both the voltage of the first output signal line $30a$ and the voltage of the second output signal line $30b$ to converge on the reference voltage VREF. Noise may also be produced during the dissolution of the feedback paths, but as discussed later, the noise produced at this time may be considered to be sufficiently small. Consequently, the voltage of the first output signal line $30a$ after the dissolution of the feedback path is roughly equal to the reference voltage VREF, and in addition, the voltage of the second output signal line $30b$ after the dissolution of the feedback path also is roughly equal to the reference voltage VREF. In other words, at this point, the signal level before performing exposure (hereinafter also called the "dark level") is roughly equal to the reference voltage VREF. Hereinafter, for the sake of convenience, the series of operations for resetting the electric potential of the charge accumulation region and silencing noise through feedback may be called the "feedback reset".

In FIG. 2, the rectangular shaded areas FBr1 and FBr2 diagrammatically illustrate periods of feedback reset. In FIG. 2, the rectangular shaded area EXP diagrammatically illustrates the exposure period. The feedback reset FBr1 before the exposure period EXP corresponds to the release of signal charge from the charge accumulation region, or what is also called the electronic shutter. As illustrated diagrammatically in FIG. 2, the feedback reset FBr1 that acts as the electronic shutter is executed sequentially row by row. In this example, the feedback reset FBr1 in the pixel cells 10 on the odd-numbered rows is conducted using the first feedback circuit FCa. Meanwhile, the feedback reset FBr1 in the pixel cells 10 on the even-numbered rows is conducted using the second feedback circuit FCb.

After the execution of the feedback reset FBr1, exposure is started. By exposure, signal charge is accumulated in the charge accumulation region. After the exposure period EXP ends, signal readout is conducted. The image signal obtained at this time has a signal level according to the luminance. In FIG. 2, the hatched rectangle SR diagrammatically illustrates the image signal readout period. As illustrated diagrammatically in FIG. 2, image signal readout is also executed sequentially row by row. In the case of image signal readout from the pixel cells 10 on the odd-numbered rows, the first switching element S1 of the switching circuit 41 and the fourth switching element S4 of the switching circuit 42 illustrated in FIG. 1 are on. In the case of image signal readout from the pixel cells 10 on the even-numbered rows, the second switching element S2 of the switching circuit 41 and the fourth switching element S4 of the switching circuit 42 illustrated in FIG. 1 are on. Hereinafter, the period from the image signal readout on a certain row to the image signal readout on the next row may be called the 1H period. Herein, since the feedback reset FBr1 is conducted before exposure, an image signal with reduced noise influence is obtained.

After image signal readout, the second feedback reset FBr2 is executed. The feedback reset FBr2 is also executed row by row. By the feedback reset FBr2 the voltage output from the first output signal line $30a$ and the voltage output from the second output signal line $30b$ becomes voltages roughly equal to the reference voltage VREF. In other words, the signal output from the first output signal line $30a$ and the signal output from the second output signal line $30b$ are lowered to a level similar to the dark level.

After the end of the feedback reset FBr2, the output signal is read out in units of rows. The output signal read out at this point is a reset signal corresponding to the reset level. In FIG. 2, the hatched rectangle RR diagrammatically illustrates the reset signal readout period. By taking the difference between the image signal read out in the period SR and the reset signal read out in the period RR, there is obtained a signal from which the influence of fixed-pattern noise have been removed.

As described with reference to FIG. 1, in an embodiment of the present disclosure, the pair of the first output signal line 30a and the second output signal line 30b is provided for each column of the pixel cells 10. A part of the pixel cells 10 belonging to the same column (for example, the pixel cells 10 on the odd-numbered rows) is connected to the first output signal line 30a, and another part of the pixel cells 10 (for example, the pixel cells 10 on the even-numbered rows) is connected to the second output signal line 30b. For this reason, it is possible to execute in parallel the readout of signals from the pixel cells 10 connected to the first output signal line 30a, and the feedback reset for the pixel cells 10 connected to the second output signal line 30b. Because of this, as illustrated diagrammatically in FIG. 2, for example, while signals are being read out on a certain row (the period SR and/or the period RR), a feedback path may be formed on another certain row, and the electronic shutter (feedback reset FBr1) may be executed. Consequently, it is possible to read out signals for forming the image of one frame faster while also reducing the influence of noise, and a high frame rate may be realized.

Figure 3:
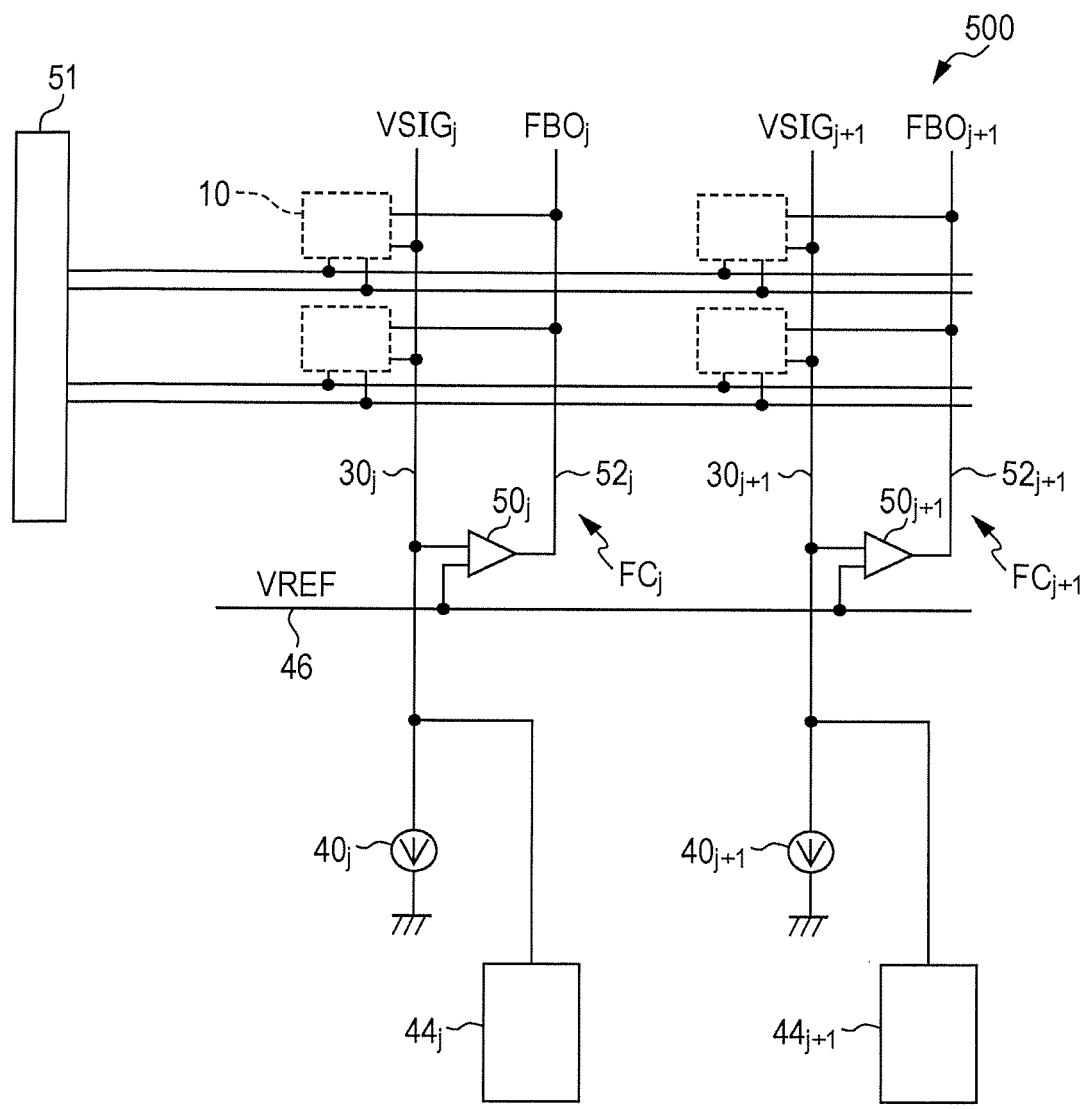
FIG. 3 is a diagram illustrating an imaging device of a comparative example that includes a circuit configuration in which all pixel cells belonging to the same column are connected to a common output signal line.

FIG. 3 illustrates, as a comparative example, an imaging device that includes a circuit configuration in which all pixel cells belonging to the same column are connected to a common output signal line. In the imaging device 500 illustrated in FIG. 3, multiple pixel cells 10 belonging to the same column are connected to a common output signal line 30. As illustrated, a constant current source 40 and a column circuit 44 are connected to each output signal line 30 provided in correspondence with each column of the pixel cells 10. The imaging device 500 includes multiple control lines which are connected to a vertical scan circuit 51 and which extend in the row direction. The multiple pixel cells 10 belonging to the same row are connected to the same control line in common.

The imaging device 500 includes, for each column of the pixel cells 10, a feedback circuit FC that includes an inverting amplifier 50 as part of itself. The output signal line 30 is connected to one of the input terminals of the inverting amplifier 50, and a feedback line 52 is connected to the output terminal. As illustrated, in this example, the multiple pixel cells 10 belonging to the same column are connected to the common feedback line 52.

In the imaging device 500 of the comparative example, all of the multiple pixel cells 10 having a connection to a certain output signal line 30 are connected to the feedback line 52 corresponding to that output signal line 30. For this reason, when forming a feedback path for a certain pixel cell 10, signals cannot be read out in parallel from the other pixel cells 10 belonging to the same column. Consequently, as illustrated in FIG. 2, on the same column, the period from the start of the period SR until the end of the period RR on a certain row and the period of the electronic shutter (feedback reset FBr1) on another row cannot be made to overlap. In other words, unless the series of operations from the start of the period SR until the end of the period RR on a certain row has finished, the electronic shutter on another row on the same column cannot be started. In other words, in a configuration that disposes one each of the output signal line 30 and the feedback line 52 for each column of the pixel cells 10, the frame rate is constrained by the period needed for noise cancelling (typically several microseconds). In contrast, according to the configuration illustrated as an example in FIG. 1, it is possible to start the electronic shutter on another row on the same column, without waiting for the series of operations from the start of the period SR until the end of the period RR on a certain row to finish.

Figure 4:
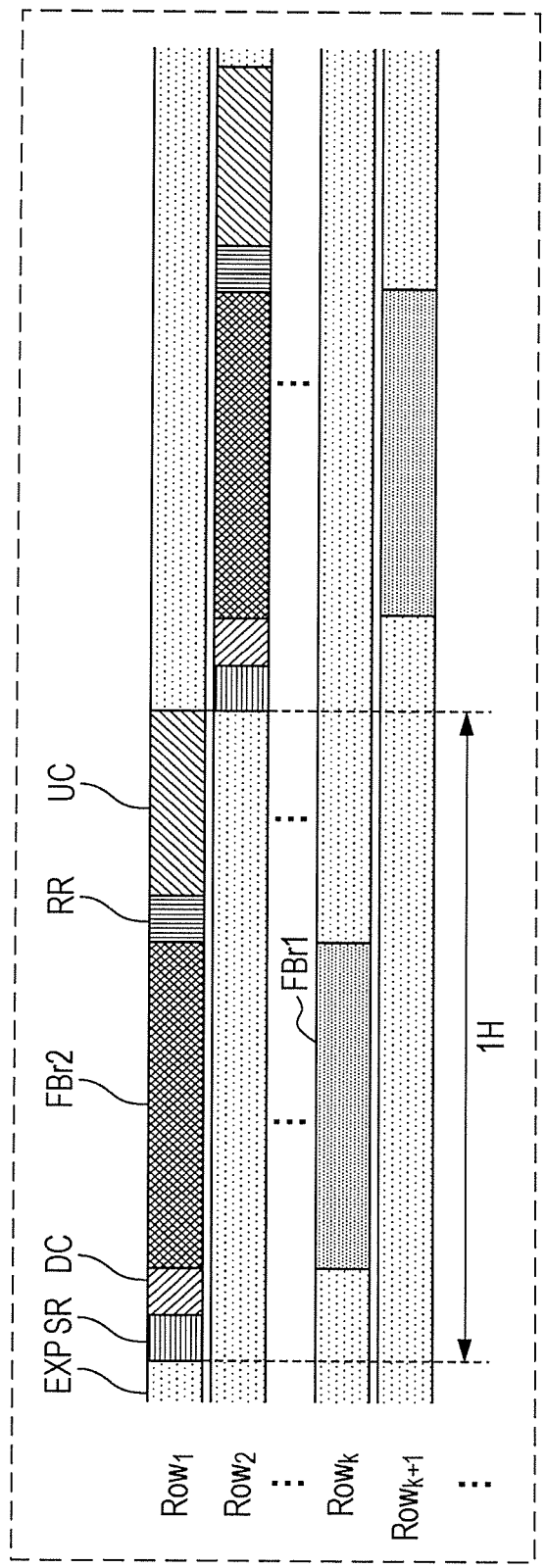
FIG. 4 is a diagram illustrating in further detail the drive timings of pixel cells on respective rows in the driving sequence illustrated in FIG. 2.

FIG. 4 illustrates in further detail the drive timings of pixel cells on respective rows of the pixel cells 10 in the imaging device 100. FIG. 4 is an example of operations in the case of extracting digital image data. Note that in FIG. 4, to avoid complexity, the feedback reset FBr1 before the exposure period EXP is not illustrated on the first row and the second row.

In the configuration illustrated as an example in FIG. 1, the column circuit 44 may include an integrating AD converter, for example. In this case, a period for converting the voltage input into the column circuit 44 to a digital output may be necessary. In FIG. 4, the hatched rectangle DC diagrammatically illustrates the period taken for AD conversion of the image signal (downcount), while the hatched rectangle UC diagrammatically illustrates the period taken for AD conversion of the reset signal (upcount). In typical operation as described with reference to FIG. 2, the difference between the image signal read out in the period SR and the reset signal read out in the period RR is acquired as the signal for forming an image, and thus the influence of characteristic variation of the respective column circuits 44 is cancelled out.

In the example illustrated in FIG. 4, the period from the start of the period SR until the end of the period UC may be designated the 1H period. As illustrated in FIG. 4, according to the configuration illustrated as an example in FIG. 1, the period from the start of the period SR until the end of the period UC on a certain row and the period of the electronic shutter (feedback reset FBr1) on another row may be made to overlap.

(Example of Circuit Configuration of Pixel Cell 10)

Figure 5:
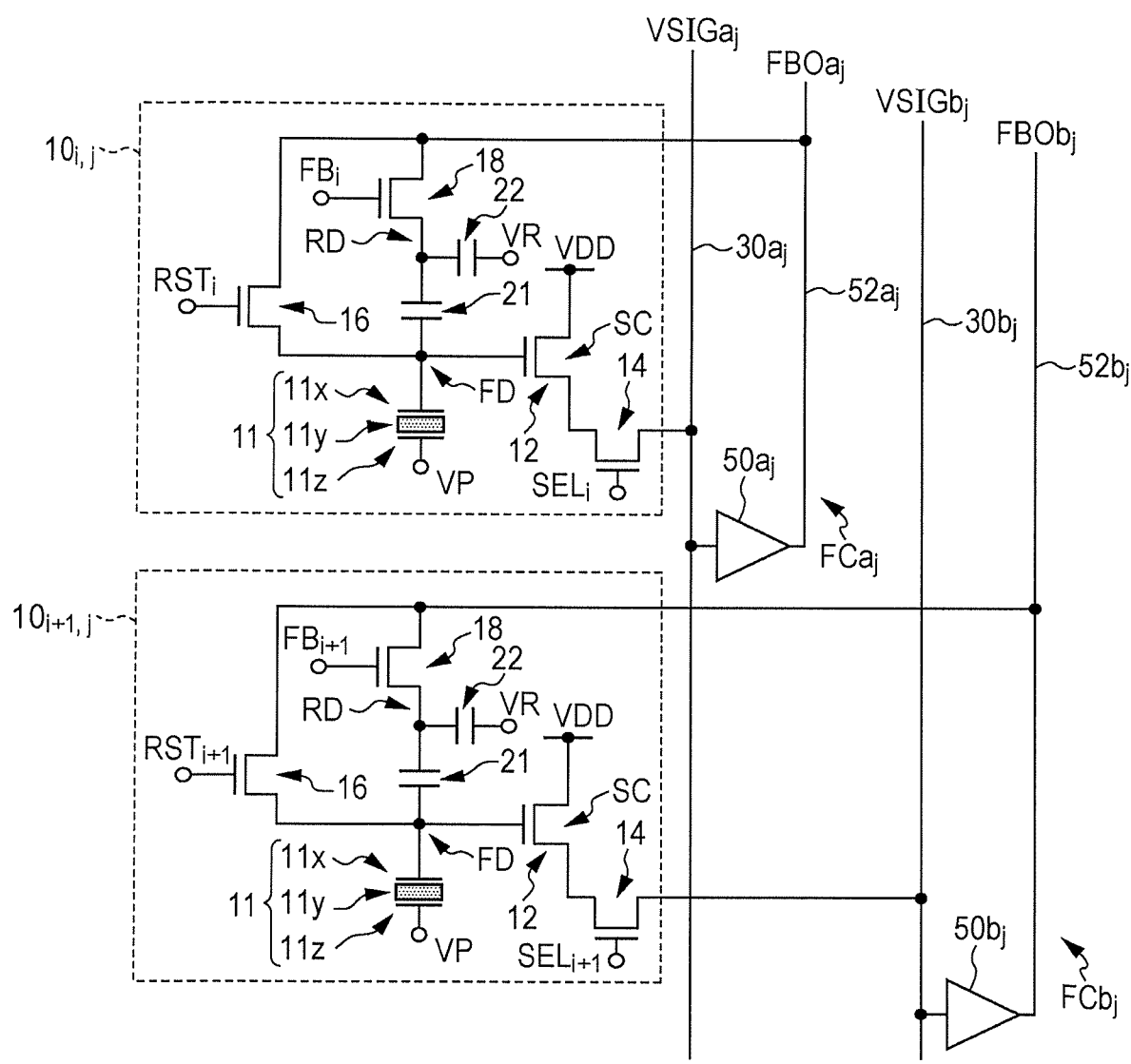
FIG. 5 is a diagram illustrating an example of the circuit configuration of a pixel cell.

FIG. 5 illustrates an example of the circuit configuration of the pixel cell 10. As illustrated in FIG. 5, each pixel cell 10 includes a photoelectric converter 11 that generates an electric signal in response to the radiation of light, and a signal detection circuit SC. Hereinafter, an imaging device having a laminated structure is illustrated as an example. In other words, a laminated structure of a pixel electrode 11x, a photoelectric conversion layer 11y, and an optically transparent counter electrode 11z is illustrated as an example of the photoelectric converter 11. Obviously, it is also possible to use a photodiode as the photoelectric converter 11.

The signal detection circuit SC includes a signal detection transistor 12. In this example, the signal detection circuit SC additionally includes an address transistor 14. As illustrated, the address transistor 14 is connected between the signal detection transistor 12 and a corresponding output signal line (the first output signal line 30a or the second output signal line 30b). The gate of the address transistor 14 is connected to an address control line (not illustrated) having a connection to a vertical scan circuit (not illustrated), and during operation of the imaging device 100, the address control signal SEL is applied. The vertical scan circuit, by controlling the switching on and off of the address transistor 14 via the address control line, is able to read out the output of the signal detection transistor 12 of a selected pixel cell 10 to the corresponding output signal line.

Typically, the signal detection transistor 12 and the address transistor 14 are FETs formed on a semiconductor substrate. Hereinafter, n-channel MOSFETs are illustrated as an example of the transistors. Note that the semiconductor substrate is not limited to being a substrate that is a semiconductor in entirety. The semiconductor substrate may also be a substrate such as an insulating substrate provided with a semiconductor layer on the surface of the side on which the imaging area is formed. On top of the semiconductor substrate on which the signal detection transistor 12 and the address transistor 14 are formed, an insulating layer covering these transistors may be disposed.

The photoelectric converter 11 includes the pixel electrode 11x, the counter electrode 11z, and the photoelectric conversion layer 11y disposed between the two. The pixel electrode 11x is provided for each pixel cell 10 on an insulating layer provided on the semiconductor substrate, so as to be separated electrically from the pixel electrodes 11x of other adjacent pixel cells 10. The pixel electrode 11x is formed from a material such as a metal like aluminum or copper, metal nitride, or polysilicon that has been given electrical conductivity by being doped with impurities.

The photoelectric conversion layer 11y is formed from an organic material, or an inorganic material such as amorphous silicon, and receives light incident through the counter electrode 11z to generate positive and negative electric charges (a hole-electron pair). One of the positive and negative electric charges generated by photoelectric conversion may be used as a signal charge. Hereinafter, the use of the hole as the signal charge will be illustrated as an example. Typically, the photoelectric conversion layer 11y is formed so as to extend over multiple pixel cells 10. The photoelectric conversion layer 11y may also include a layer made of an organic material and a layer made of an inorganic material.

The counter electrode 11z is formed from a transparent conductive material such as ITO, and is disposed on the light incident side of the photoelectric conversion layer 11y. Typically, the counter electrode 11z is formed so as to extend over the multiple pixel cells 10, similarly to the photoelectric conversion layer 11y. During operation of the imaging device 100, a bias voltage of approximately 10 V, for example, is applied to the counter electrode 11z. By using the bias voltage to raise the electric potential of the counter electrode 11z higher than the electric potential of the pixel electrode 11x, the positive electric charges to be used as signal charges (holes, for example) generated by photoelectric conversion may be collected by the pixel electrode 11x.

The pixel electrode 11x is electrically connected to the gate of the signal detection transistor 12. Hereinafter, the node FD between the pixel electrode 11x and the gate of the signal detection transistor 12 may be called the "charge accumulation node FD". The signal charges collected by the pixel electrode 11x are accumulated in a charge accumulation region that includes the charge accumulation node FD as part of itself. As illustrated, one of the source and the drain (herein, the drain) of the signal detection transistor 12 is connected to a power supply line to which a power supply voltage VDD is applied during operation of the imaging device 100 (source follower power supply), and the signal detection transistor 12 amplifies and outputs an electrical signal generated by the photoelectric converter 11.

In the configuration illustrated as an example in FIG. 5, one of the source and the drain of the signal detection circuit SC is connected to the charge accumulation node FD, while the other of the source and the drain includes a reset transistor 16 connected to a corresponding feedback line (the first feedback line 52a or the second feedback line 52b). The gate of the reset transistor 16 is connected to a reset control line (not illustrated), and during operation of the imaging device 100, a reset control signal RST is applied via the reset control line. The reset control line is connected to a vertical scan circuit (not illustrated), for example. The vertical scan circuit, by switching on the reset transistor 16 via the reset control line, is able to reset the electric potential of the charge accumulation node FD of the selected pixel cell 10. In this example, switching on the reset transistor 16 causes the voltage of the corresponding feedback line to be applied to the charge accumulation node FD.

In the example illustrated in FIG. 5, the signal detection circuit SC additionally includes a first capacitive element 21, a second capacitive element 22, and a feedback transistor 18. The first capacitive element 21 is connected between the charge accumulation node FD and one of the source and the drain of the feedback transistor 18. In other words, one of the source and the drain of the feedback transistor 18 is electrically connected to the pixel electrode 11x of the photoelectric converter 11 via the first capacitive element 21. The other of the source and the drain of the feedback transistor 18 is connected to the corresponding feedback line (the first feedback line 52a or the second feedback line 52b). Hereinafter, the node between the feedback transistor 18 and the first capacitive element 21 may be called the "reset drain node RD".

The gate of the feedback transistor 18 is connected to a feedback control line (not illustrated), and during operation of the imaging device 100, a feedback control signal FB is applied via the feedback control line. The feedback control line is connected to a vertical scan circuit (not illustrated), for example. The vertical scan circuit toggles the feedback transistor 18 on and off via the feedback control line.

If the feedback transistor 18 is switched on while the address transistor 14 is in the on state, a feedback path is formed including the signal detection transistor 12 of the selected pixel cell 10 as part of itself. In the illustrated example, switching on the address transistor 14 and the feedback transistor 18 of the pixel cell $10i,j$ on the (i)th row, for example, causes the formation of a first feedback path including the signal detection transistor 12 of the pixel cell $10_{i,j}$ as part of itself. If the address transistor 14 and the feedback transistor 18 of the pixel cell $10_{i+1,j}$ on the (i+1)th row are switched on, there is formed a second feedback path including the signal detection transistor 12 of the pixel cell $10_{i+1,j}$ as part of itself. In this way, the first feedback circuit FCa may be considered to be a circuit that includes the signal detection transistor 12 of a pixel cell 10 having a connection to the first output signal line 30a as part of the first feedback path. Also, the second feedback circuit FCb may be considered to be a circuit that includes the signal detection transistor 12 of a pixel cell 10 having a connection to the second output signal line 30b as part of the second feedback path.

During the formation of the first feedback path, the first feedback circuit FCa negatively feeds back the output of the signal detection transistor 12 in the pixel cell 10 having a connection to the first output signal line 30a to one of the source and the drain of the feedback transistor 18, the one not being connected to the reset drain node RD. During the formation of the second feedback path, the second feedback circuit FCb negatively feeds back the output of the signal detection transistor 12 in the pixel cell 10 having a connection to the second output signal line 30b to one of the source and the drain of the feedback transistor 18, the one not being connected to the reset drain node RD.

The second capacitive element 22 is a capacitive element having a larger capacitance value than the first capacitive element. One electrode of the second capacitive element 22 is connected to the reset drain node RD. During operation of the imaging device 100, a certain voltage VR (0 V, for example) is applied to the other electrode of the second capacitive element 22. During operation of the imaging device 100, the voltage VR may be a fixed voltage, or a pulse voltage, for example.

A capacitance circuit including a series connection of the first capacitive element 21 and the second capacitive element 22 is provided between the charge accumulation node FD and the reference potential VR. In addition, the signal detection circuit SC includes the reset transistor 16 that controls the supply of the reset voltage to the charge accumulation node FD and the feedback transistor 18 that controls the formation of a feedback path. Thus, kTC noise may be reduced more effectively.

An example of the control of each transistor and each switching element in the first operational example discussed above will now be described in further detail with reference to FIG. 6.

Figure 6:
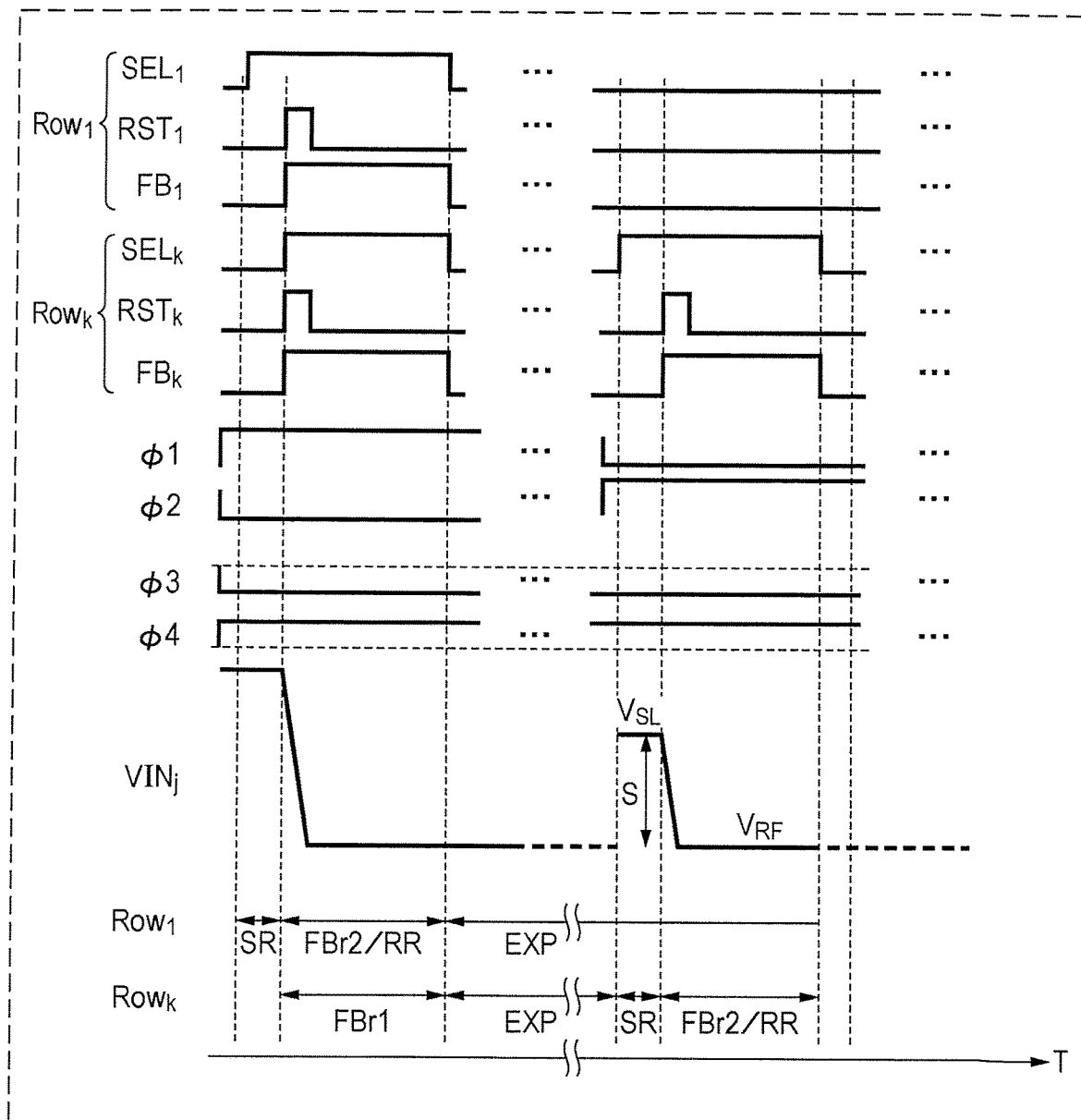
FIG. 6 is a diagram illustrating a typical example of the changes in the control signals for each transistor and each switching element in the operational example described with reference to FIG. 4.

FIG. 6 illustrates a typical example of the changes in the control signals for each transistor and each switching element in the operational example described with reference to FIG. 4. Herein, an example of operation in the pixel cell $10_{1,j}$ on the 1st row, (j)th column and the pixel cell $10_{k,j}$ on the kth row, (j)th column of the pixel array PA will be described. Herein, the kth row is one of the even-numbered rows.

In FIG. 6, the graphs of $SEL_1$ and $SEL_k$ represent changes in the address control signal SEL on the 1st row and the kth row, respectively. Similarly, the graphs of $RST_1$ and $RST_k$ represent changes in the reset control signal RST on the 1st row and the kth row, respectively, and the graphs of $FB_1$ and $FB_k$ represent changes in the feedback control signal FB on the 1st row and the kth row, respectively. The graphs of φ1 to φ4 represent changes in the control signals of the first switching element S1 to the fourth switching element S4, respectively. Herein, the first switching element S1 to the fourth switching element S4 are all taken to be switched on when the control signal is at the high level. In FIG. 6, approximate changes in the input voltage $VIN_j$ for the column circuit $44_j$, as well as the driving sequences illustrated in FIG. 4 in relation to the 1st row and the kth row, are also illustrated.

In the example illustrated in FIG. 6, first, the control signals φ1 and φ4 are switched to the high level. At this point, the column circuit $44_j$ enters a state of being connected to the first output signal line $30a_j$, and the voltage $VSIGa_j$ of the first output signal line $30a_j$ is input into the column circuit $44_j$ as $VIN_j$. In this example, the address control signal $SEL_1$ is taken to be at the high level. Consequently, the voltage $VSIGa_j$ of the first output signal line $30a_j$ is a voltage corresponding to the amount of signal charge accumulated in the charge accumulation node FD of the pixel cell $10_{1,j}$ in the exposure period. In other words, an image signal of the pixel cell $10_{1,j}$ is read out by the column circuit $44_j$. As illustrated, after reading out the image signal, the feedback reset FBr2 and the reset signal readout are executed for the pixel cell $10_{1,j}$.

At this point, focusing on the kth row, the feedback reset FBr1 is executed as an electronic shutter on the kth row. Typically, control like the following is executed on each transistor of the pixel cells 10 on the kth row.

In the feedback reset FBr1, the address control signal $SEL_k$ on the kth row is set to the high level, and the address transistor 14 of the pixel cell $10_{k,j}$ is switched on. By switching on the address transistor 14, the output voltage of the signal detection transistor 12 of the pixel cell $10_{k,j}$ is applied to the second output signal line $30b_j$.

In the state with the address control signal $SEL_k$ at the high level, suppose that the reset control signal $RST_k$ and the feedback control signal $FB_k$ are at the high level. The reset control signal $RST_k$ being at the high level causes the reset transistor 16 of the pixel cell $10_{k,j}$ to switch on, and through the reset transistor 16, the second feedback line $52b_j$ is electrically connected to the charge accumulation node FD of the pixel cell $10_{k,j}$. Consequently, the voltage of the second feedback line $52b_j$ is supplied to the charge accumulation node FD of the pixel cell $10_{k,j}$, and the voltage of the charge accumulation node FD is reset to a voltage at which the voltage of the second output signal line $30b_j$ becomes the reference voltage VREF.

Next, by setting the reset control signal $RST_k$ to the low level, the reset transistor 16 of the pixel cell $10_{k,j}$ is switched off. As the reset transistor 16 switches off, kTC noise is produced. However, when the reset transistor 16 switches off, the feedback transistor 18 is still on, thus maintaining the state in which the second feedback path that negatively feeds back the output of the signal detection transistor 12 is formed. For this reason, provided that A is the gain of the second feedback circuit $FCb_j$, the kTC noise produced by the switching off of the reset transistor 16 is cancelled up to a magnitude of $1/(1+A)$.

Next, by setting the feedback control signal $FB_k$ to the low level, the feedback transistor 18 of the pixel cell $10_{k,j}$ is switched off. As the feedback transistor 18 switches off, kTC noise is produced. However, herein, the signal detection circuit SC includes the first capacitive element 21 and the second capacitive element 22, as described with reference to FIG. 5. For this reason, the magnitude of the kTC noise imparted to the voltage of the charge accumulation node FD by the switching off of the feedback transistor 18 may be suppressed by a factor of $(Cfd/C2)^{1/2} \times (C1/(C1+Cfd))$ for the case of directly connecting the feedback transistor 18 to the charge accumulation node FD without providing the first capacitive element 21 and the second capacitive element 22 in the signal detection circuit SC. In this way, by providing the first capacitive element 21 and the second capacitive element 22 in the signal detection circuit SC, it is possible to further reduce the magnitude of the kTC noise imparted to the voltage of the charge accumulation node FD. Note that in the above mathematical expression, Cfd, C1, and C2 represent the capacitance of the charge accumulation node FD, the capacitance of the first capacitive element 21, and the capacitance of the second capacitive element 22, respectively, and "x" denotes multiplication.

By the feedback reset FBr1, the voltage $VSIGb_j$ of the second output signal line $30b_j$ becomes a voltage level nearly equal to the reference voltage VREF. As in this example, when noise cancellation starts, that is, when the reset transistor 16 switches off, the voltage of the output signal line (herein, the second output signal line $30b_j$) is made to approach the reference voltage VREF that acts as a post-noise cancellation target voltage. Thus, it is possible to cancel the kTC noise in a comparatively short time. After the feedback reset FBr1 ends, the address transistor 14 is switched off, and the exposure (accumulation of signal charge) of the kth row starts.

As illustrated in the lower part of FIG. 6, in this example, in parallel with the feedback reset FBr1 of the kth row, the image signal readout, the feedback reset FBr2 (the feedback reset after exposure), and the reset signal readout from the pixel cell $10_{1,j}$ on the 1st row are executed. In an embodiment of the present disclosure, such parallel control is possible because the output signal line that accepts the output of the pixel cell $10_{k,j}$ (the second output signal line $30b_j$) and the output signal line that accepts the output of the pixel cell $10_{1,j}$ (the first output signal line $30a_j$) are separate signal lines. Hereinafter, a typical example of control during image signal and reset signal readout will be described. Since the signal readout operation itself is shared in common among the respective rows, herein, control during the signal readout on the kth row will be described.

The respective graphs on the right side of FIG. 6 will be referenced. As illustrated, when reading out a signal from the kth row, the controls signals φ1 and φ2 are changed to low level and high level, respectively. As a result, the column circuit $44_j$ enters a state of being connected to the second output signal line $30b_j$, and the voltage $VSIGb_j$ of the second output signal line $30b_j$ is input into the column circuit $44_j$ as $VIN_j$.

After connecting the column circuit $44_j$ and the second output signal line $30b_j$, the address control signal $SEL_k$ of the kth row is set to the high level, thereby causing the address transistor 14 of the pixel cell $10_{k,j}$ to switch on. As a result of the address transistor 14 switching on, the voltage $VSIGb_j$ of the second output signal line $30b_j$ changes to a voltage corresponding to the amount of signal charge accumulated in the charge accumulation node FD in the exposure period. In other words, the column circuit $44_j$ receives an image signal from the pixel cell $10_{k,j}$ via the second output signal line $30b_j$. At this point, the voltage level of the voltage value $V_{SL}$ is acquired as the image signal from the pixel cell $10_{k,j}$.

After acquisition of the image signal, the feedback reset FBr2 is executed. As FIG. 6 demonstrates, the control of each transistor in the feedback reset FBr2 may be mostly similar to the feedback reset FBr1.

After the end of the feedback reset FBr2, the readout of the reset signal from the pixel cell $10_{k,j}$ is executed. Specifically, after the reset transistor 16 is switched off, the voltage level of the second output signal line $30bj$ is acquired at a time (typically immediately after the feedback transistor 18 is switched off) after the elapse of a time preset as a noise cancellation period. Similarly to the case of the feedback reset FBr1, by the feedback reset FBr2, the input voltage $VIN_j$ into the column circuit $44_j$ changes to a voltage level nearly equal to the reference voltage VREF. Consequently, a voltage level of the voltage value $V_{RF}$ that is nearly equal to the reference voltage VREF is acquired as the reset signal.

By taking the difference between the image signal and the reset signal, there is obtained a signal from which fixed-pattern noise has been removed. In other words, the difference between the voltage level of the voltage value $V_{SL}$ and the voltage level of the voltage value $V_{RF}$ is the signal S used for image formation. In this way, there is obtained a signal from which kTC noise and fixed-pattern noise have been removed.

(Second Operational Example in Imaging Device 100)

In many cases, the feedback resets FBr1 and FBr2 discussed above take a long time compared to signal readout. The inventors investigated ways of achieving even higher frame rates, and discovered that the feedback reset FBr2 for obtaining the reset signal may be omitted.

Figure 7:
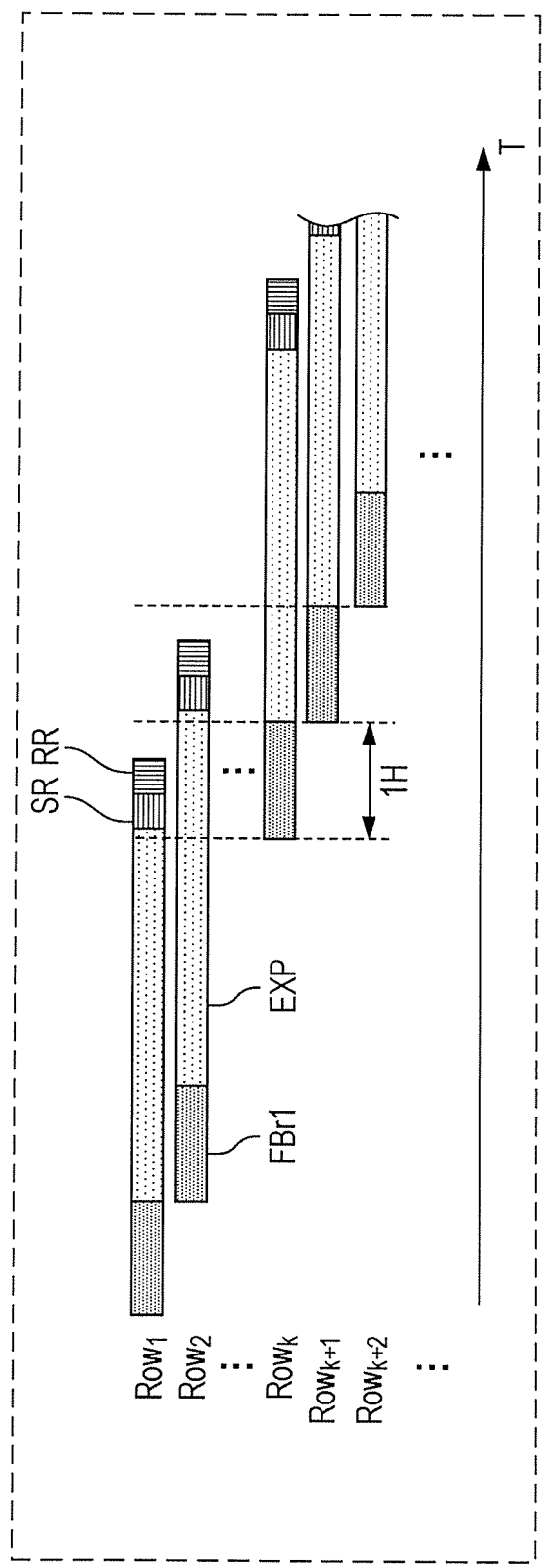
FIG. 7 is a conceptual diagram illustrating another example of operations in an imaging device.
Figure 8:
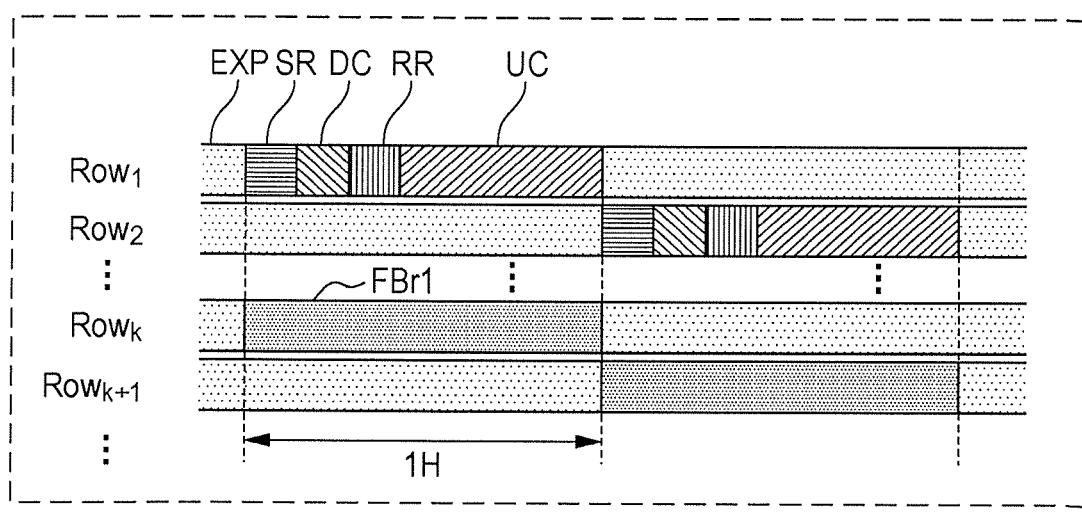
FIG. 8 is a diagram illustrating in further detail the drive timings on respective rows of pixel cells, in the case of applying the second operational example outlined in FIG. 7 to the acquisition of digital image data.

FIG. 7 is a conceptual diagram illustrating another example of operations in the imaging device 100. FIG. 8 illustrates in further detail the drive timings on respective rows of pixel cells 10, in the case of applying the second operational example outlined in FIG. 7 to the acquisition of digital image data. For example, as a comparison between FIG. 7 and FIG. 2 demonstrates, in the second operational example described herein, the feedback reset FBr1 is executed as an electronic shutter for each row of the pixel array PA, whereas the second feedback reset FBr2 following the exposure period EXP for the row targeted for signal readout is omitted. For each row, by reducing the number of feedback resets that take a long time compared to signal readout, the 1H period may be shortened further. Consequently, even higher frame rates may be achieved.

Figure 9:
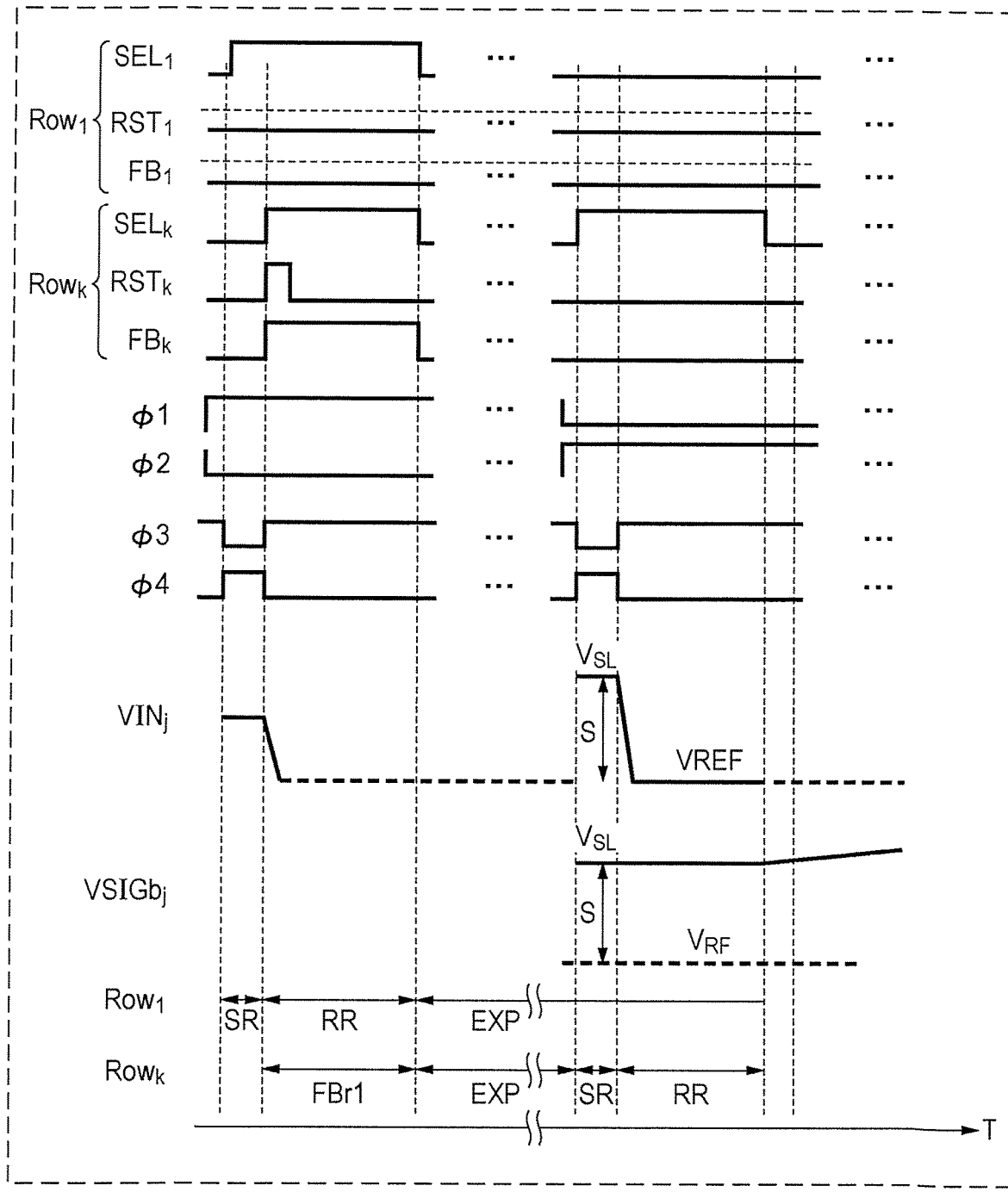
FIG. 9 is a diagram illustrating a typical example of the changes in the control signals for each transistor and each switching element in the second operational example outlined in FIG. 7.

FIG. 9 illustrates a typical example of the changes in the control signals for each transistor and each switching element in the second operational example outlined in FIG. 7. First, the respective graphs on the left side of FIG. 9 will be referenced. In this example, the readout of the image signal and the readout of the reset signal on the 1st row are executed while the feedback reset FBr1 (electronic shutter) is being executed on the kth row. The control of the address control signal $SEL_k$, the reset control signal $RST_k$, and the feedback control signal $FB_k$ on the kth row in the feedback reset FBr1 of the kth row is similar to the control described with reference to FIG. 6, and description thereof will be omitted.

As discussed earlier, the signal readout operation itself is shared in common among the respective rows. Consequently, instead of the operation of reading out a signal from the 1st row, the operation of reading out a signal from the kth row will be described with reference to the respective graphs on the right side of FIG. 9. Note that in this example, when reading out a signal from the kth row, the address control signal $SEL_1$, the reset control signal $RST_1$, and the feedback control signal $FB_1$ of the 1st row are all set to the low level, and the 1st row is in a state in which exposure is being executed, for example.

When reading out an image signal from the kth row, first, the control signals φ2 and φ4 are set to the high level. As a result, the column circuit $44_j$ becomes connected to the second output signal line $30b_j$. Also, the address control signal $SEL_k$ of the kth row is set to the high level, thereby causing the address transistor 14 of the pixel cell $10_{k,j}$ to switch on. Consequently, the voltage $VSIGb_j$ of the second output signal line $30b_j$ changes to the output voltage of the signal detection transistor 12 of the pixel cell $10_{k,j}$, or in other words, a voltage corresponding to the signal charge accumulated in the charge accumulation node FD of the pixel cell $10_{k,j}$ (herein, a voltage value $V_{SL}$). As a result, the output voltage of the pixel cell $10_{k,j}$ is applied to the column circuit $44_j$. In other words, the column circuit $44_j$ acquires an image signal from the pixel cell $10_{k,j}$ (herein, the voltage value $V_{SL}$).

After acquisition of the image signal, the control signals φ4 and φ3 are switched to low level and high level, respectively. As a result, a connection is established between the reference voltage line 46 and the column circuit $44_j$, and the reference voltage VREF is applied to the column circuit $44_j$. The column circuit $44_j$ acquires this reference voltage VREF as the reset signal. In other words, in the second operational example, the difference between the voltage acquired in the period SR (voltage value: $V_{SL}$) and the reference voltage VREF acquired in the period RR is acquired as the signal S used for image formation.

In the first operational example discussed earlier, for each pixel cell 10, the voltage value $V_{RF}$, which is acquired after executing the feedback reset FBr2 and which is nearly equal to the reference voltage VREF, is used as the voltage level of the reset signal. This is because the voltage level after executing the feedback reset FBr2 may be used as the dark level. As described already, the voltage level in the case of executing the feedback reset FBr1 as an electronic shutter is roughly equal to the reference voltage VREF, and in addition, the voltage level after executing the feedback reset FBr2 may be considered nearly equal to the reference voltage VREF. For this reason, the voltage level after executing the feedback reset FBr2 may also be treated as the dark level. By acquiring the voltage level after executing the feedback reset FBr2 for each pixel cell 10, and using that voltage level as the dark level for each pixel cell 10, fixed-pattern noise arising from variations among the pixel cells 10 and also among columns of the pixel cells 10 may be removed. The causes of such fixed-pattern noise may be, for example, variations in the threshold voltage (Vth) in the signal detection transistor 12 for each pixel cell 10, variations in the magnitude of the constant current on each output signal line (or in other words, each column), and variations in the load on each output signal line (such as interconnect resistance and parasitic capacitance).

In contrast, in the second operational example, the reference voltage VREF itself is utilized as the reset level. From the reasons given above, the dark level in each pixel cell 10 is nearly equal to the voltage level of the reference voltage VREF. Consequently, it is possible to use the reference voltage VREF as a standard dark level shared in common among all pixels.

On the other hand, if the reference voltage VREF is treated as a common standard voltage level, it is difficult to completely remove the fixed-pattern noise discussed above by subtracting the reference voltage VREF from the voltage $V_{SL}$ that acts as the image signal. However, the fixed-pattern noise discussed earlier may be removed relatively easily. For example, variations in the signal level among columns of the pixel cells 10 may be acquired in the break period of the frame scan (also called the blanking interval), and information about the variations among the columns may be held in memory. By subtracting variations for each column from the acquired image data based on the information about the variations among the columns, the fixed-pattern noise arising from the variations among the columns may be removed. Alternatively, a dark level accounting for the variations among the pixel cells 10 and also among the columns of the pixel cells 10 may be acquired in advance and held in memory external to the imaging device 100. For example, by subtracting the dark level held in external memory from the output of the imaging device 100 in a circuit external to the imaging device 100, it is still similarly possible to reduce the influence of fixed-pattern noise. If the output of a signal with residual fixed-pattern noise to equipment external to the imaging device 100 is allowed, the step of removing fixed-pattern noise in the imaging device 100 may also be omitted.

In this way, by using the voltage level of the reference voltage VREF as the dark level, it is possible to quickly acquire a signal S with reduced noise influence similarly to the first operational example, while also omitting the feedback reset FBr2. According to the second operational example, the frame rate may be improved even further compared to the first operational example.

Additionally, since the feedback reset between the acquisition of the image signal and the acquisition of the reset signal is omitted, the second operational example is advantageous compared to the first operational example from the perspective of kTC noise reduction. For example, suppose that N is the amount of noise remaining after a single feedback reset, and in addition, assume that the remaining amount of noise is shared in common between the feedback resets FBr1 and FBr2. In this case, the total amount of noise when executing two feedback resets is expressed as $(N^2+N^2)^{1/2}=2^{1/2}N$. In other words, by setting the number of feedback resets to one, the total amount of noise may be reduced by a factor of $(1/2)^{1/2}$ compared to executing two feedback resets.

Like the circuit configuration illustrated as an example in FIG. 1, a configuration enabling use of the switching circuit 42 to selectively apply the voltage of the reference voltage line 46 to the column circuit 44 is adopted, for example. Thus, both lower noise and improved frame rates may be achieved. Additionally, a configuration that connects the reference voltage line 46 to the input terminal of the inverting amplifiers 50 (first inverting amplifier 50a and second inverting amplifier 50b) to enable supply of the reference voltage to the inverting amplifier 50 and the column circuit 44 is adopted. Thus, the voltage level of the reference voltage may be used as the dark level. According to an embodiment of the present disclosure, the signal level before performing exposure and the voltage level of the reference voltage are nearly the same. Accordingly, almost no reduction in dynamic range occurs, even when using the difference between the voltage level of the image signal and the voltage of the reference signal rather than the dark level.

Note that the exposure period EXP may also be started again following the period RR, without executing the electronic shutter. For example, in the example illustrated in FIG. 9, the exposure period EXP may be started again following the period RR on the kth row. In the first operational example, since the second feedback reset FBr2 is executed every time an image signal is acquired, the output of the output signal line after acquisition of the image signal drops to a voltage level close to the dark level. In contrast, in the second operational example, since the second feedback reset FBr2 is not executed, even though the input voltage $VIN_j$ for the column circuit $44_j$ after acquisition of the reset signal falls to the reference voltage VREF, the value of the voltage (herein, $VSIGb_j$) on the output signal line (herein, the second output signal line $30b_j$) is still maintained at $V_{SL}$. In other words, by starting the exposure period EXP again following the period RR, further accumulation of signal charge is possible without destroying the information obtained from the previous exposure. In other words, by applying the second operational example, non-destructive readout is possible.

(Third Operational Example in Imaging Device 100)

Depending on the situation in which the imaging device is used, it may be beneficial to prioritize shooting at a high frame rate rather than reducing noise. For example, in situations where fast sampling is demanded, such as applications for detecting objects moving at high speeds, fixed-pattern noise does not pose a major problem. Alternatively, in cases such as capturing images of the night sky in which the exposure time is a long time, such as in units of several tens of minutes or several hours, it is beneficial to obtain intermediate sensing data for deciding an appropriate amount of exposure.

Figure 10:
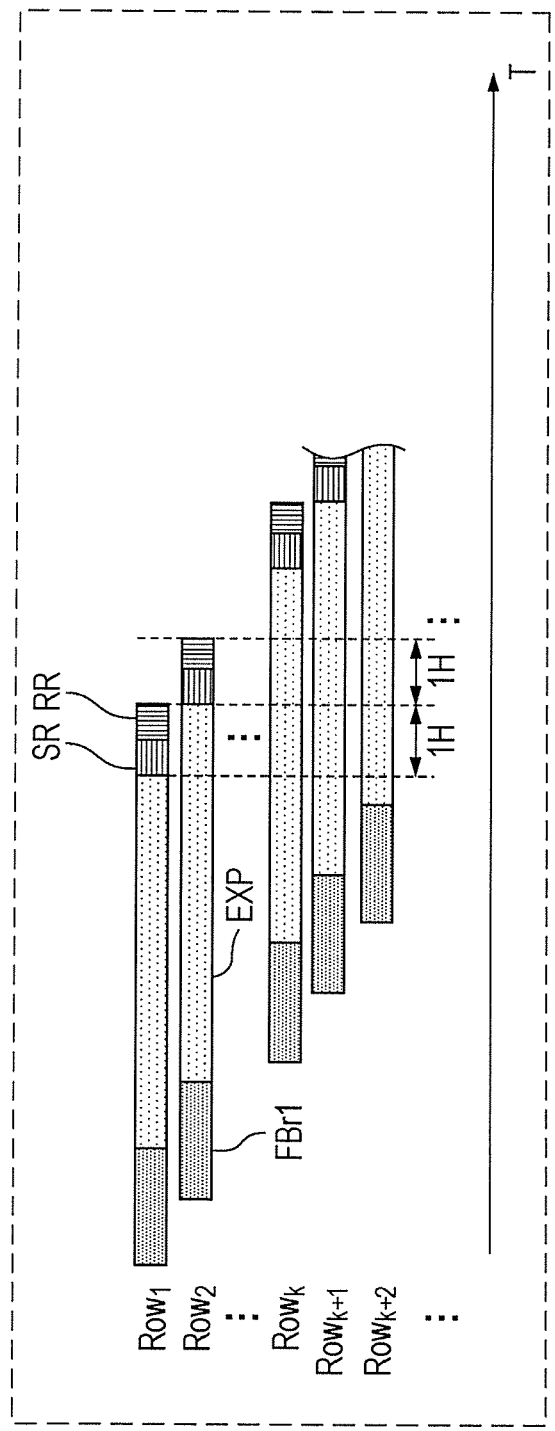
FIG. 10 is a conceptual diagram illustrating yet another example of operations in an imaging device.
Figure 11:
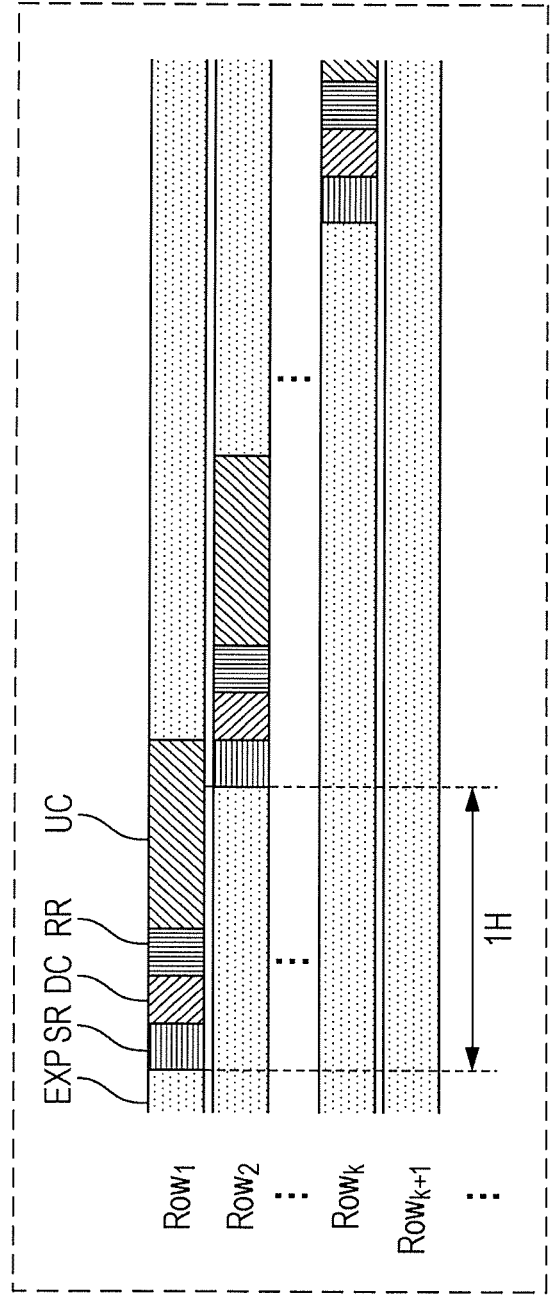
FIG. 11 is a diagram illustrating in further detail the drive timings on respective rows of pixel cells, in the case of applying the third operational example outlined in FIG. 10 to the acquisition of digital image data.

FIG. 10 is a conceptual diagram illustrating yet another example of operations in the imaging device 100. FIG. 11 illustrates in further detail the drive timings on respective rows of pixel cells 10, in the case of applying the third operational example outlined in FIG. 10 to the acquisition of digital image data. In the third operational example described herein, on each row of the pixel array PA, the feedback reset FBr1 is executed as an electronic shutter at the beginning of shooting (not illustrated in FIG. 11), and after that, exposure and image signal readout are executed several times. Also, as a comparison of FIG. 11 and FIG. 8 demonstrates, for example, driving is executed so that the period UC for AD conversion of the reset signal on a certain row overlaps with the image signal readout period SR on the next row. Consequently, an even shorter 1H period may be achieved.

Figure 12:
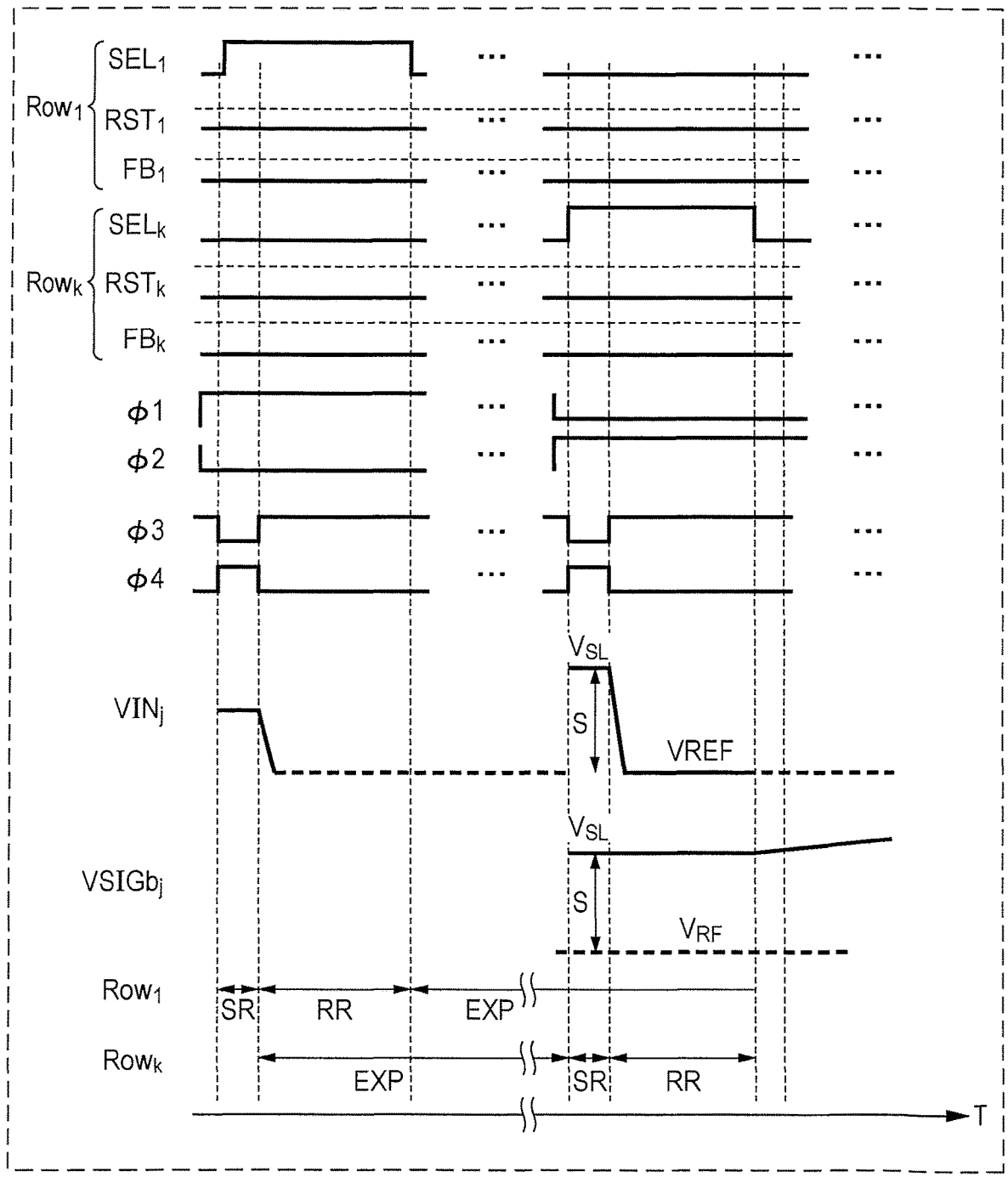
FIG. 12 is a diagram illustrating a typical example of the changes in the control signals for each transistor and each switching element in the third operational example outlined in FIG. 10.

FIG. 12 illustrates a typical example of the changes in the control signals for each transistor and each switching element in the third operational example outlined in FIG. 10. The respective graphs on the right side of FIG. 12 illustrate an example of the changes in each control signal when reading out a signal from the kth row. The specific control in this example is similar to the control described with reference to FIG. 9.

As illustrated on the right side of FIG. 12, non-destructive readout is also possible in the third operational example. In the third operational example, the feedback reset FBr1 is executed as an electronic shutter when exposure is started, several exposure periods are provided over a certain period, and image signal readout is executed for each exposure period. Based on each of the obtained image signals, it is possible to construct multiple images corresponding to the multiple readouts. Since the image signal readout is non-destructive, there is obtained a group of successive images in which brightness increases in a time series. This group of images may be utilized as sensing images. For example, by acquiring a group of successive images in a certain period, it is possible to detect an object moving at high speed based on the data of these images. Alternatively, an optimal exposure time may be decided from the brightness changes in the group of successive images.

The third operational example is applicable to usages such as fast autofocus and the sensing of moving objects. Note that since the feedback reset FBr1 is executed at the beginning of shooting, it is possible to obtain sensing images in which the influence of kTC noise has been reduced. Note that a reference-signal generator according to the present disclosure is exemplified by the voltage supply circuit 48 in the present embodiment.

Second Embodiment

Figure 13:
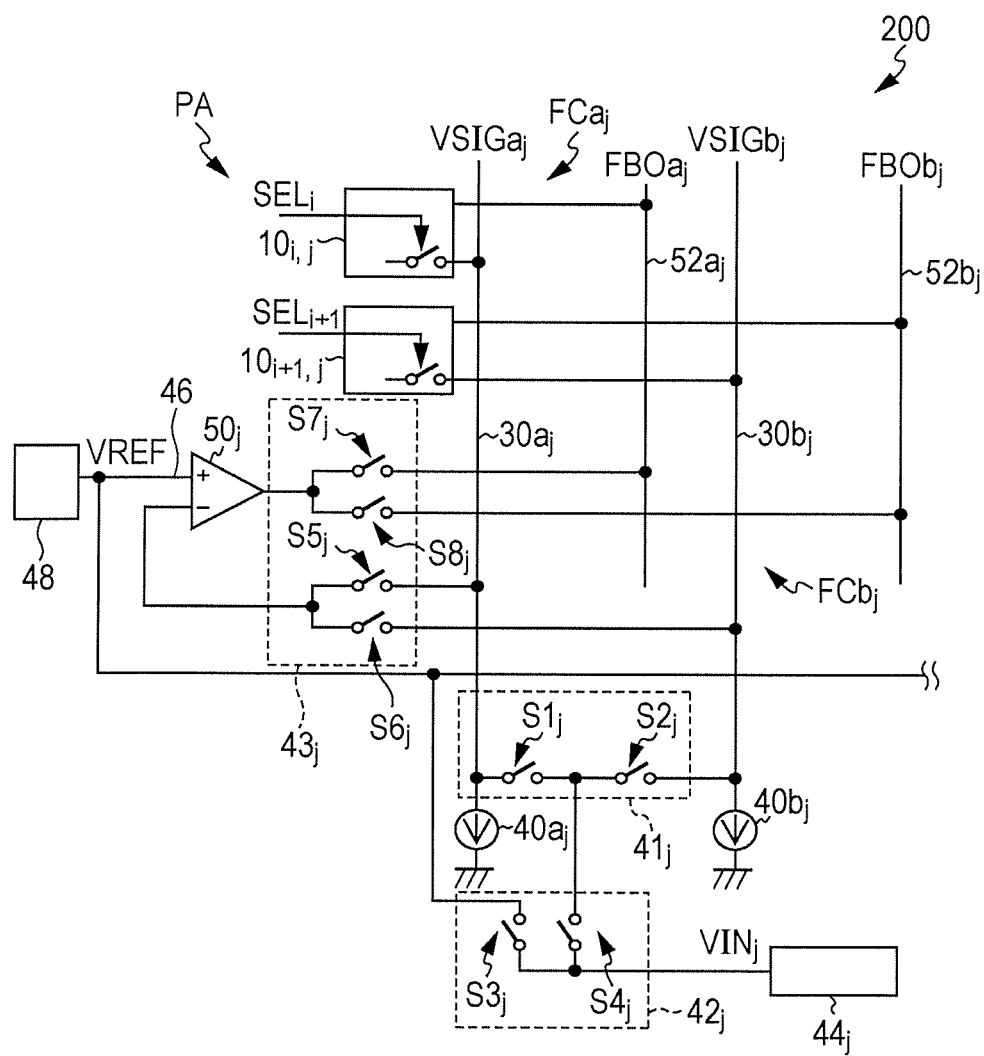
FIG. 13 is a diagram illustrating an overview of an exemplary circuit configuration of an imaging device according to a second embodiment of the present disclosure.

FIG. 13 illustrates an overview of an exemplary circuit configuration of an imaging device according to a second embodiment of the present disclosure. In FIG. 13, among the multiple pixel cells 10 included in the pixel array PA, the two representative pixel cells $10_{i,j}$ and $10_{i+1,j}$ belonging to the (j)th column are illustrated. The major difference between the imaging device 200 illustrated in FIG. 13 and the imaging device 100 described with reference to FIG. 1 is that the imaging device 100 includes the first inverting amplifier 50a and the second inverting amplifier 50b in correspondence with the first output signal line 30a and the second output signal line 30b, whereas in the imaging device 200, a single inverting amplifier 50 is provided for each column. Also, the imaging device 200 includes a third switching circuit 43 connected between the pair of the first output signal line 30a and the second output signal line 30b, and the inverting amplifier 50.

In common with the first embodiment, the pixel cells 10 on odd-numbered rows (or even-numbered rows) in the pixel array PA are connected to the first output signal line 30a, while the pixel cells 10 on the even-numbered rows (or odd-numbered rows) are connected to the second output signal line 30b. As illustrated, herein, the first output signal line 30a and the second output signal line 30b are connected to the switching circuit 41 and the switching circuit 43.

In the configuration illustrated as an example in FIG. 13, the switching circuit 43 includes a fifth switching element S5 to an eighth switching element S8. The fifth switching element S5 is connected between the first output signal line 30a and the inverting input terminal of the inverting amplifier 50, while the sixth switching element S6 is connected between the second output signal line 30b and the inverting input terminal of the inverting amplifier 50. The seventh switching element S7 is connected between the output terminal of the inverting amplifier 50 and the first feedback line 52a, while the eighth switching element S8 is connected between the output terminal of the inverting amplifier 50 and the second feedback line 52b. The fifth switching element S5 to the eighth switching element S8 are FETs, for example.

The reference voltage line 46 is connected to the non-inverting input terminal of the inverting amplifier 50, similarly to the imaging device 100.

The fifth switching element S5 and the sixth switching element S6 are controlled to operate in a complementary manner. The seventh switching element S7 and the eighth switching element S8 are controlled to operate in a complementary manner. Also, the switching circuit 43 is controlled so that when the fifth switching element S5 is on, the seventh switching element S7 is on, and when the sixth switching element S6 is on, the eighth switching element S8 is on. When the fifth switching element S5 and the seventh switching element S7 are on, there is formed a first feedback path that includes the inverting amplifier $50_j$ as part of the path, and negatively feeds back the output of the pixel cell $10_{i,j}$. On the other hand, when the sixth switching element S6 and the eighth switching element S8 are on, there is formed a second feedback path that includes the inverting amplifier $50_j$ as part of the path, and negatively feeds back the output of the pixel cell $10_{i+1,j}$.

In the second embodiment, the first feedback circuit FCa and the second feedback circuit FCb share the inverting amplifier 50. For this reason, the configuration illustrated as an example in FIG. 13 is unsuited to control in which the feedback reset FBr1 and the feedback reset FBr2 are executed in parallel between different rows on the same column as illustrated in FIG. 4. However, similarly to the first embodiment, it is possible to apply control similar to the second and third operational examples discussed earlier. Consequently, fast readout of low-noise signals is possible. Additionally, non-destructive readout is also possible. Furthermore, in the second embodiment, since the first feedback circuit FCa and the second feedback circuit FCb share the inverting amplifier 50, it is not necessary to provide two inverting amplifiers for each column of the multiple pixel cells 10. Consequently, from the perspective of reducing power consumption and/or the surface area of the pixel cells, the second embodiment is advantageous over the first embodiment.

Figure 14:
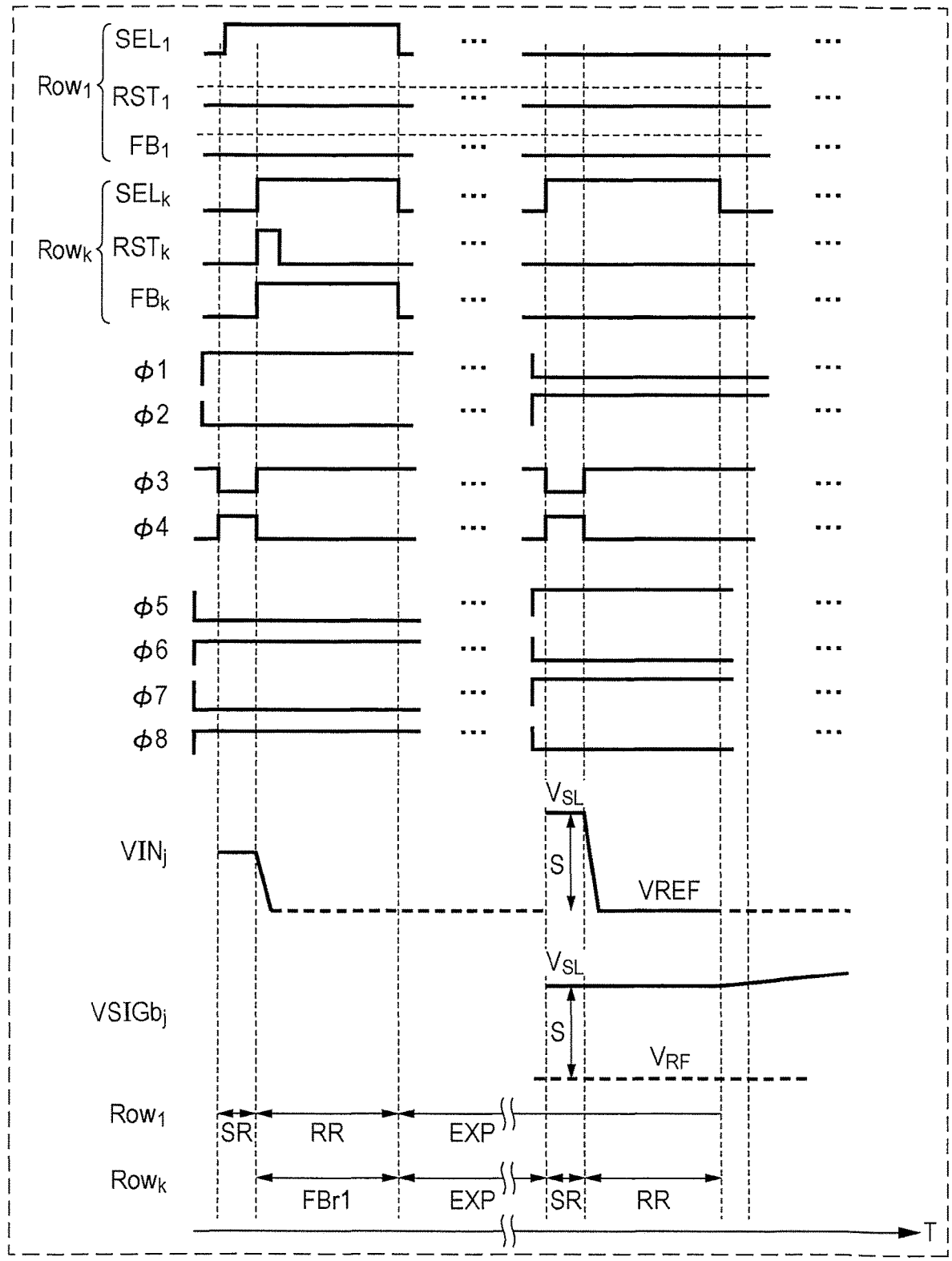
FIG. 14 is a diagram illustrating a typical example of the changes in the control signals for each transistor and each switching element, in the case of applying the second operational example outlined in FIG. 7 to an imaging device.

FIG. 14 illustrates a typical example of the changes in the control signals for each transistor and each switching element, in the case of applying the second operational example outlined in FIG. 7 to the imaging device 200. In FIG. 14, the graphs of φ5 to φ8 represent changes in the control signals of the fifth switching element S5 to the eighth switching element S8 in the switching circuit 43, respectively. Herein, the fifth switching element S5 to the eighth switching element S8 are all taken to be switched on when the control signal is at the high level.

The respective graphs on the left side of FIG. 14 will be referenced. In this example, in the image signal readout period SR and the reset signal readout period RR for reading out signals from the pixel cell $10_{1,j}$ on the 1st row, the control signals φ6 and the φ8 are set to the high level. By setting the control signals φ6 and φ8 to the high level, the second feedback circuit is formed. Consequently, as illustrated in FIG. 14, in parallel with the readout of signals from the pixel cell $10_{1,j}$ on the 1st row, the feedback reset FBr1 may be executed as an electronic shutter for the pixel cell $10_{k,j}$ on the kth row.

Next, the respective graphs on the right side of FIG. 14 will be referenced. Herein, the formation of the second feedback circuit is dissolved by switching the control signals φ6 and φ8 to the low level. In this state, setting the address control signal $SEL_k$, the control signal φ2, and the control signal φ4 to the high level causes an electrical connection to be established between the second output signal line $30b_j$ and the column circuit 44$_j$, and an image signal may be read out from the pixel cell 10$_{k,j}$ on the kth row. In this example, the reference voltage VREF likewise is acquired as the reset signal. By subtracting the reference voltage VREF acquired in the period RR from the voltage acquired in the period SR (voltage value: V$_{SL}$), the signal S used for image formation may be acquired.

As the graph of VSIGb$_j$ demonstrates, in the second embodiment, non-destructive readout likewise is possible. Even in the case of applying the third operational example, it is sufficient to execute control mostly similar to the first embodiment on each transistor and each switching element.

Third Embodiment

Figure 15:
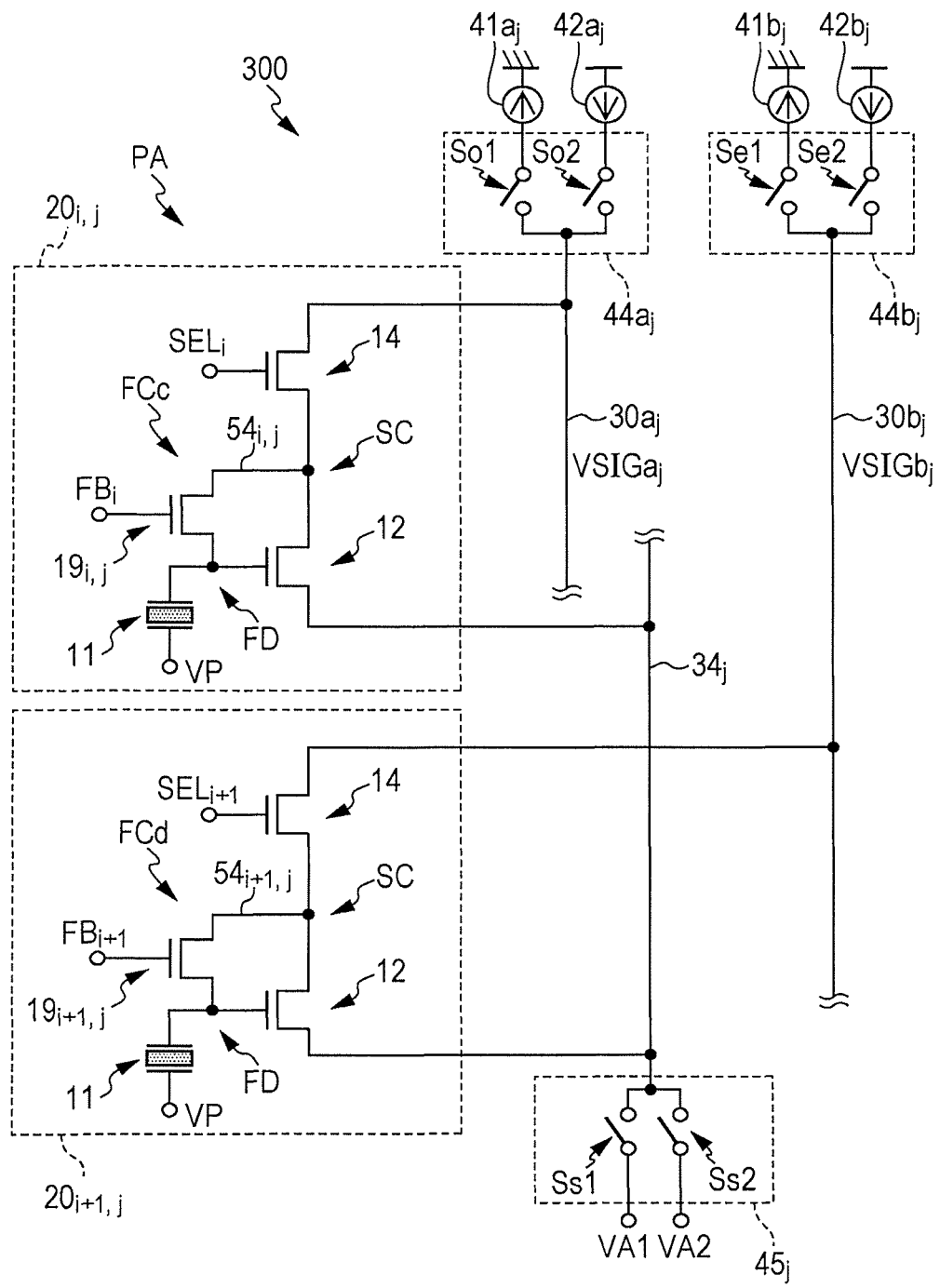
FIG. 15 is a diagram illustrating an overview of an exemplary circuit configuration of an imaging device according to a third embodiment of the present disclosure.

FIG. 15 illustrates an overview of an exemplary circuit configuration of an imaging device according to a third embodiment of the present disclosure. The pixel array PA in the imaging device 300 illustrated in FIG. 15 includes multiple pixel cells 20 arrayed in a matrix. In FIG. 15, among the multiple pixel cells 20 included in the pixel array PA, the two representative pixel cells 20$_{i,j}$ and 20$_{i+1,j}$ belonging to the (j)th column are illustrated. The major differences between the imaging device 300 and the imaging device 100 described with reference to FIG. 1 as well as the imaging device 200 described with reference to FIG. 13 are that the first feedback circuit FCc in the imaging device 300 does not include the first inverting amplifier 50$a_j$ provided for each column of the multiple pixel cells 20 in correspondence with the first output signal line 30$a_j$, and in addition, the second feedback circuit FCd in the imaging device 300 does not include the second inverting amplifier 50$bj$ provided for each column of the multiple pixel cells 20 in correspondence with the second output signal line 30$b_j$. In the imaging device 300, the first feedback path and the second feedback path are formed inside the pixel cells 20$_{i,j}$ and 20$_{i+1,j}$, respectively.

In the configuration illustrated as an example in FIG. 15, the source of the signal detection transistor 12 in each pixel cell 20 is connected to the drain of the address transistor 14. The source of the address transistor 14 is connected to the corresponding output signal line (the first output signal line 30$a$ or the second output signal line 30$b$). In the illustrated example, the source of the address transistor 14 in the pixel cell 20$_{i,j}$ on the (i)th row is connected to the first output signal line 30$a_j$, while the source of the address transistor 14 in the pixel cell 20$_{i+1,j}$ on the (i+1)th row is connected to the second output signal line 30$b_j$.

Herein, one end of the first output signal line 30$a_j$ and the second output signal line 30$b_j$ is connected to switching circuits 44$a_j$ and 44$b_j$, respectively. The switching circuit 44$a_j$ connected to the first output signal line 30$a_j$ includes a switching element So1 connected between a constant current source 41$a_j$ and the first output signal line 30$a_j$, and a switching element Se2 connected between a constant current source 42$a_j$ and the first output signal line 30$a_j$. The switching circuit 44$b_j$ connected to the second output signal line 30$b_j$ includes a switching element Se1 connected between a constant current source 41$b_j$ and the second output signal line 30$b_j$, and a switching element Se2 connected between a constant current source 42$b_j$ and the second output signal line 30$b_i$. One end of the constant current source 41$a_j$ and the constant current source 41$b_j$ is grounded.

The drain of the signal detection transistor 12 in the pixel cell 20$_{i,j}$ on the (i)th row and the drain of the signal detection transistor 12 in the pixel cell 20$_{i+1,j}$ on the (i+1)th row both are connected to a power supply line 34$_j$. The power supply line 34$_j$ is provided for each column of the multiple pixel cells 20. A switching circuit 45$_j$ is connected to one end of the power supply line 34$_j$. The switching circuit 45$_j$ includes a switching element Ss1 connected between the supply source of a certain first voltage VA1 and the power supply line 34$_j$, and a switching element Ss2 connected between the supply source of a certain second voltage VA2 and the power supply line 34$_j$. Typically, the first voltage VA1 and the second voltage VA2 are the power supply voltage VDD and ground (GND), respectively. An amplifier is configured by the switching circuit 45 and the signal detection transistor 12 in each pixel cell 20.

The first feedback circuit FCc in the pixel cell 20$_{i,j}$ on the (i)th row includes a feedback transistor 19$_{i,j}$, in which one of the source and the drain is connected to the charge accumulation node FD. The other of the source and the drain of the feedback transistor 19$_{i,j}$ is connected by a feedback line 54$_{i,j}$ to a node between the signal detection transistor 12 and the address transistor 14. The parasitic capacitance of the feedback transistor 19$_{i,j}$ and the charge accumulation node FD constitutes an RC filter circuit. By switching on the feedback transistor 19$_{i,j}$ on the (i)th row through control of the gate voltage FB$_i$ of the feedback transistor 19$_{i,j}$, there is formed a first feedback circuit that negatively feeds back the electrical signal of the photoelectric converter 11 of the pixel cell 20$_{i,j}$. In the third embodiment, the first feedback circuit is closed inside the pixel cell 20$_{i,j}$.

The second feedback circuit FCb in the pixel cell 20$_{1+i,j}$ on the (i+1)th row, similarly to the first feedback circuit FCc, includes a feedback transistor 19$_{1+1,j}$ in which one of the source and the drain is connected to the charge accumulation node FD. The other of the source and the drain of the feedback transistor 19$_{i+1,j}$ is connected by a feedback line 54$_{i+1,j}$ to a node between the signal detection transistor 12 and the address transistor 14. By switching on the feedback transistor 19$_{1+i,j}$ on the (i+1)th row, there is formed a second feedback circuit that negatively feeds back the electrical signal of the photoelectric converter 11 of the pixel cell 20$_{1+i,j}$. Herein, the second feedback circuit is also closed inside the pixel cell 20$_{i+1,j}$.

At this point, a typical example of operations during signal readout and during feedback reset in each pixel cell 20 will be described briefly. For example, during the readout of a signal from the pixel cell 20$_{i,j}$ on the (i)th row, with the address transistor 14 on the (i)th row switched on, the switching element Ss1 of the switching circuit 45$_j$ connected to the power supply line 34$_j$ and the switching element So1 of the switching circuit 44$a_j$ connected to the first output signal line 30$a_j$ are switched on. At this point, the switching element Ss2 of the switching circuit 45$_j$ and the switching element So2 of the switching circuit 44$a_j$ are switched off. Consequently, the voltage VA1 (a power supply voltage, for example) is supplied to the drain of the signal detection transistor 12 of the pixel cell 20$_{i,j}$. At this point, the signal detection transistor 12 and the constant current source 41$a_j$ form a source follower, and a voltage corresponding to the amount of charge accumulated in the charge accumulation node FD is read out to the first output signal line 30$a_j$. The amplification ratio of the source follower at this point is approximately 1×.

During the readout of a signal from the pixel cell 20$_{i+1,j}$ on the (i+1)th row, with the address transistor 14 on the (i+1)th row switched on, the switching element Ss1 of the switching circuit 45$_j$ and the switching element Se1 of the switching circuit 44$b_j$ connected to the second output signal line 30$b_j$ are switched on. At this point, it is sufficient to switch off the switching element Ss2 of the switching circuit $45_j$ and the switching element Se2 of the switching circuit $44b_j$. Consequently, the voltage VA1 is supplied to the drain of the signal detection transistor 12 of the pixel cell $20_{i+1,j}$. At this point, a source follower is formed by the signal detection transistor 12 and the constant current source $41b_j$, and a voltage corresponding to the amount of charge accumulated in the charge accumulation node FD of the pixel cell $20_{i+1,j}$ is read out to the second output signal line $30b_j$.

On the other hand, during a feedback reset, the address transistor 14 in the pixel cell 20 which is subject to the feedback reset is switched on. For example, in the case of executing a feedback reset on the pixel cell $20_{i,j}$ on the (i)th row, the address transistor 14 on the (i)th row is switched on. In the case of executing a feedback reset on the pixel cell $20_{i+1,j}$ on the (i+1)th row, the address transistor 14 on the (i+1)th row is switched on.

For example, in the case of executing a feedback reset on the pixel cell $20_{i,j}$ on the (i)th row, with the address transistor 14 on the (i)th row switched on, the feedback transistor $19_{i,j}$ is switched on. Consequently, there is formed a first feedback path that negatively feeds back the output of the signal detection transistor 12 to one of the source and the drain of the feedback transistor $19_{i,j}$. At this point, by switching the switching element Ss1 and the switching element Ss2 of the switching circuit $45_j$ connected to the power supply line $34_j$ off and on, respectively, the voltage VA2 (herein, ground) is applied to the signal detection transistor 12. Also, the switching element So1 and the switching element So2 of the switching circuit $44a_j$ connected to the first output signal line $30a_j$ are switched off and on, respectively. Consequently, the voltage of the charge accumulation node FD of the pixel cell $20_{i,j}$ is reset to a certain voltage.

Subsequently, the voltage level of the feedback control signal $FB_i$ is lowered to a level between the high level and the low level, for example, and after that, the feedback control signal $FB_i$ is set to the low level. By setting the voltage level of the feedback control signal $FB_i$ to a level lower than the high level, the operating band of the feedback transistor $19_{i,j}$ becomes narrower compared to when the feedback control signal $FB_i$ is at the high level. When the feedback control signal $FB_i$ reaches the low level, the feedback transistor $19_{i,j}$ switches off, and the formation of the first feedback path is dissolved. At this point, if the operating band of the feedback transistor $19_{i,j}$ is in a lower state than the operating band of the signal detection transistor 12, the kTC noise produced by the switching off of the feedback transistor $19_{i,j}$ becomes small compared to the case of not forming the first feedback path. Provided that (−D) is the amplification ratio of the amplifier formed by the switching circuit 45 and the signal detection transistor 12, the kTC noise produced by the switching off of the feedback transistor $19i,j$ is suppressed by a factor of $(1/(1+D))^{1/2}$ compared to the case of not forming the first feedback path. In this way, with the feedback control signal $FB_i$, band limiting of the feedback transistor $19_{i,j}$ is possible. The value of D may be set to a numerical value greater than 1, ranging approximately from several tens to several hundred. Likewise, in the case of executing a feedback reset on the pixel cell $20_{i+1,j}$ on the (i+1)th row, for example, it is sufficient to execute control similar to the above.

Figure 27:
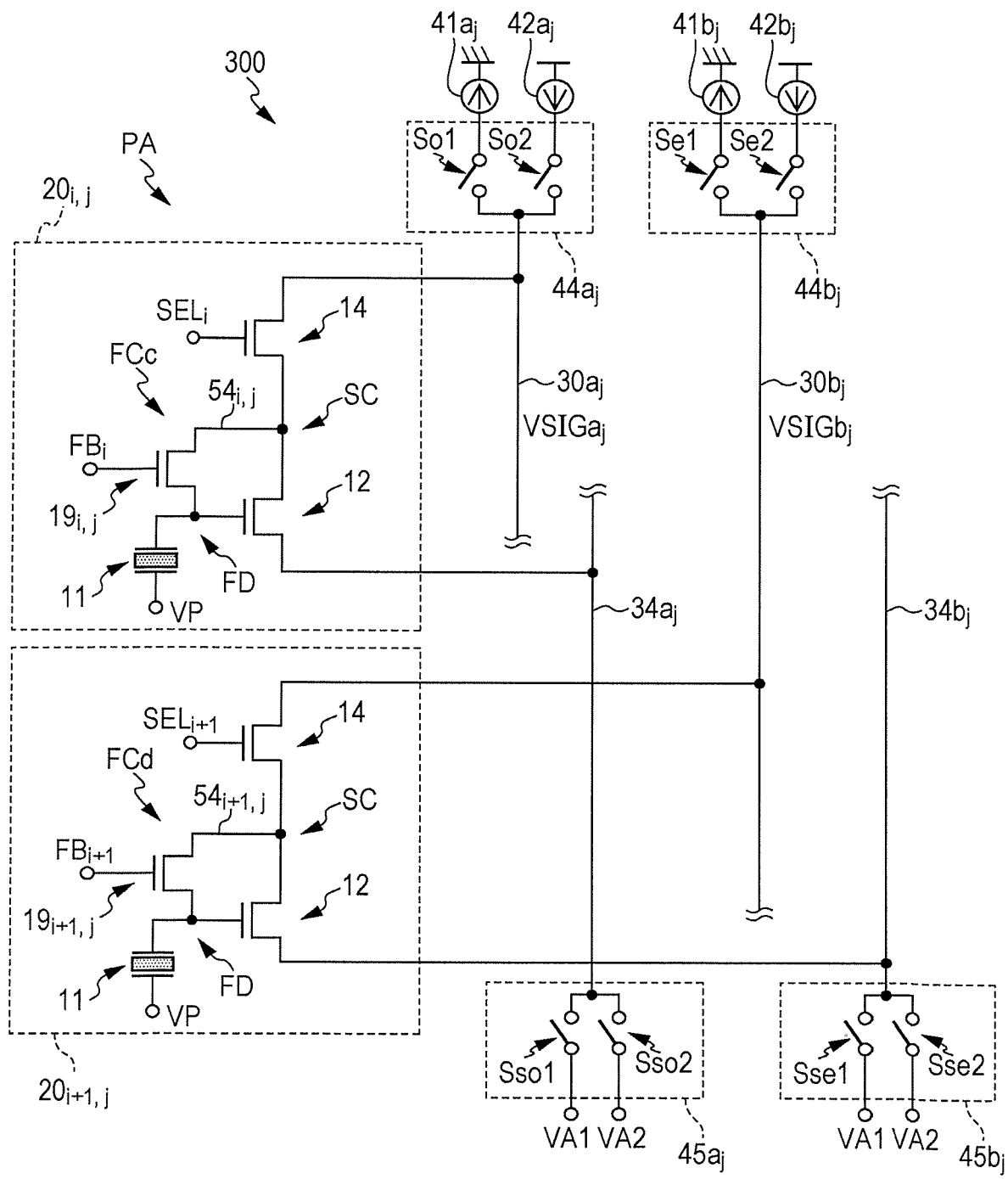
FIG. 27 is a diagram illustrating an overview of an exemplary circuit configuration of an imaging device according to a modification of the third embodiment of the present disclosure.

In the third embodiment, by switching the current with respect to the pixel cell 20, the signal detection transistor is made to function as a source follower during signal readout, and as an amplifier during feedback reset. As discussed above, even when a feedback path is formed inside each pixel, the kTC noise remaining in the charge accumulation node FD may be suppressed compared to the case of no feedback. Note that control may also be executed in which a ramp voltage is used as the feedback control signal $FB_i$, so that the voltage level of the feedback control signal $FB_i$ decreases from the high level to the low level. Note that in the imaging device 300 illustrated in FIG. 15, the power supply line $34_j$ and the switching circuit $45_j$ are shared between the pixel cell $20_{i,j}$ and the $20_{i+1,j}$. However, as illustrated in FIG. 27, a power supply line $34a_j$ and a switching circuit $45a_j$ may be provided for the pixel cell $20_{i,j}$, while a power supply line $34b_j$ and a switching circuit $45b_j$ may be provided for the pixel cell $20_{i+1,j}$.

Figure 16:
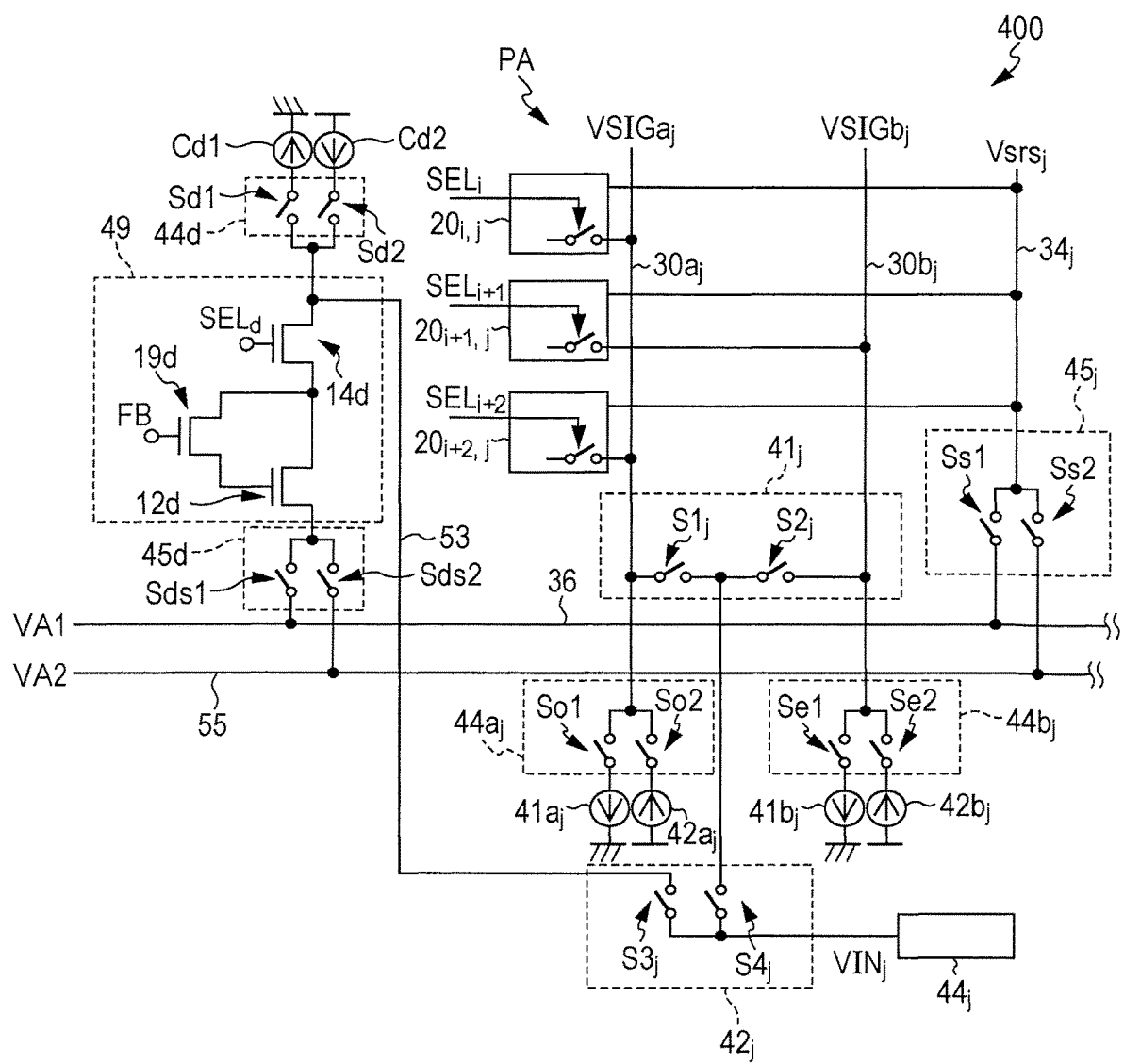
FIG. 16 is a diagram illustrating an overview of an exemplary circuit configuration of an imaging device according to a third embodiment of the present disclosure.

FIG. 16 illustrates an overview of an exemplary circuit configuration of an imaging device according to the third embodiment of the present disclosure. The imaging device 400 illustrated in FIG. 16 includes a common voltage line 36 that supplies the first voltage VA1 discussed earlier, and a common voltage line 55 that supplies the second voltage VA2 discussed earlier. In this example, one end of the switching element Ss1 and one end of the switching element Ss2 in the switching circuit $45j$ provided in correspondence with each column are connected to the common voltage lines 36 and 55, respectively. For example, by controlling the switching on and off of the switching element Ss1 and the switching element Ss2 in the switching circuit $45_j$ on the (j)th column, the voltage $Vsrs_j$ of the power supply line $34_j$ on the (j)th column may be switched between the first voltage VA1 and the second voltage VA2.

The imaging device 400 illustrated as an example in FIG. 16 includes a dummy cell 49 as a replica of the pixel cell 20 outside the pixel array PA. The dummy cell 49 includes a first dummy transistor 12d, a second dummy transistor 14d, and a third dummy transistor 19d. The first dummy transistor 12d, the second dummy transistor 14d, and the third dummy transistor 19d have a similar configuration to the signal detection transistor 12, the address transistor 14, and the feedback transistor 19 of each pixel cell 20 included in the pixel array PA, respectively.

The source of the first dummy transistor 12d is connected to the drain of the second dummy transistor 14d. The source of the second dummy transistor 14d is connected to a switching circuit 44d that includes switching elements Sd1 and Sd2. During operation of the imaging device 400, an address control signal $SEL_d$ is applied to the gate of the second dummy transistor 14d. During operation of the imaging device 400, the second dummy transistor 14d may be in the on state continuously.

As illustrated, the switching element Sd1 is connected between the second dummy transistor 14d and a constant current source Cd1, while the switching element Sd2 is connected between the second dummy transistor 14d and a constant current source Cd2. The pair of the constant current sources Cd1 and Cd2 is a pair of current sources having a configuration similar to the pair of the constant current sources 41a and 42a as well as the pair of the constant current sources 41b and 42b discussed earlier. The constant current sources Cd1 and Cd2 may be shared in common with the constant current sources 41a and 42a or with the constant current sources 41b and 42b discussed earlier. Typically, the operation of switching on and off the switching elements Sd1 and Sd2 of the switching circuit 44d is shared in common with the operation of switching on and off the switching elements So1 and So2 of the switching circuit 44a or the switching elements Se1 and Se2 of the switching circuit 44b discussed earlier.

Meanwhile, the drain of the first dummy transistor 12d is connected to a switching circuit 45d that includes switching elements Sds1 and Sds2. The switching element Sds1 is connected between the first dummy transistor 12d and the common voltage line 36, while the switching element Sds2 is connected between the first dummy transistor 12d and the common voltage line 55. Typically, the operation of switching on and off the switching elements Sds1 and Sds2 of the switching circuit 45d is shared in common with the operation of switching on and off the switching elements Ss1 and Ss2 of the switching circuit 45 discussed earlier. The common voltage line 36 has a connection to a power supply (not illustrated), and as a result of the switching element Sds1 being switched on, the first voltage VA1 is supplied to the dummy cell 49.

One of the source and the drain of the third dummy transistor 19d is connected to the gate of the first dummy transistor 12d. The other of the source and the drain of the third dummy transistor 19d is connected to the source of the first dummy transistor 12d. The gate voltage FB of the third dummy transistor 19d may be controlled similarly to the feedback control signal $FB_i$ for the pixel cells 20. If the third dummy transistor 19d is switched on by control of the gate voltage FB, a feedback circuit similar to the first or second feedback circuit in the pixel cells 20 may be formed inside the dummy cell 49. Also, by switching off the third dummy transistor 19d, the formation of this feedback circuit is dissolved. Through control of the gate voltage FB of the third dummy transistor 19d, it is possible to generate a voltage level similar to a voltage acquired by a feedback reset in the pixel cells 20. The generated voltage is supplied to the second switching circuit 42 via a reference signal line 53, one end of which is connected to the node between the second dummy transistor 14d and the switching circuit 44d. The other end of the reference signal line 53 is connected to the third switching element S3 of the second switching circuit 42.

By sharing the first voltage VA1 between each of the pixel cells 20 and the dummy cell 49, with the dummy cell 49 it is possible to generate a voltage level similar to a voltage acquired by a feedback reset in each of the pixel cells 20. In other words, a voltage nearly equal to the dark level of each of the pixel cells 20 may be generated by the dummy cell 49. Namely, the voltage generated by the dummy cell 49 is a voltage corresponding to the reset voltage of the pixel cells 20. By utilizing the voltage generated by the dummy cell 49, fixed-pattern noise may be removed based on a voltage level similar to the voltage acquired by a feedback reset in each of the pixel cells 20, thereby making it possible to suppress a reduction in dynamic range.

Figure 17:
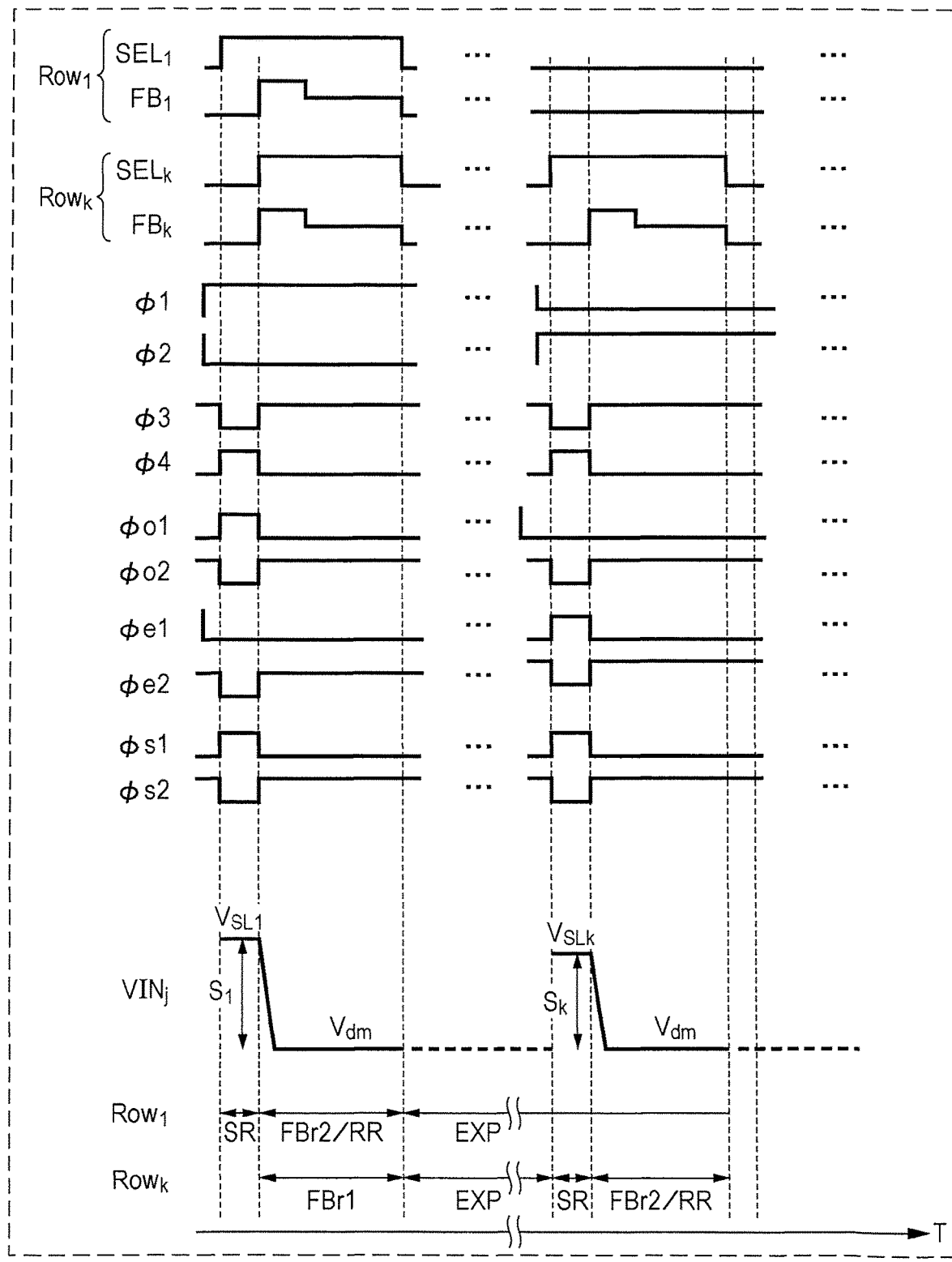
FIG. 17 is a diagram illustrating a typical example of the changes in the control signals for each transistor and each switching element when applying the first operational example described with reference to FIG. 4 to an imaging device.

FIG. 17 illustrates a typical example of the changes in the control signals for each transistor and each switching element when applying the first operational example described with reference to FIG. 4 to the imaging device 400. In FIG. 17, the graphs of φo1, φo2, φe1, φe2, φs1, and φs2 represent changes in the control signals of the switching elements So1 and So2 of the switching circuit 44a, the switching elements Se1 and Se2 of the switching circuit 44b, and the switching elements Ss1 and Ss2 of the switching circuit 45, respectively. The switching elements So1 and So2, the switching elements Se1 and Se2, and the switching elements Ss1 and Ss2 are all taken to be switched on when the control signal is at the high level.

The respective graphs on the left side of FIG. 17 will be referenced. In this example, in the reset signal readout period RR following the image signal readout period SR for reading out from the pixel cell $20_{1,j}$ on the 1st row, the feedback reset FBr1 is executed in the pixel cell $20_{k,j}$ on the kth row. In the image signal readout period SR for reading out from the pixel cell $20_{1,j}$ on the 1st row, the address control signal $SEL_1$ is set to the high level. At this point, the control signal φs1 is at the high level, and the first voltage VA1 is supplied to the pixel cell $20_{1,j}$ on the 1st row. Also, at this time, by setting the control signals φ1 and φ4 to the high level, the column circuit $44_j$ becomes electrically connected to the first output signal line $30a_j$. As illustrated, among the control signals φo1, φo2, φe1, and φe2, by setting φo1 to the high level and the others to the low level, a voltage $V_{SL1}$ corresponding to the voltage of the charge accumulation node FD of the pixel cell $20_{1,j}$ is applied to the column circuit $44_j$.

In the reset signal readout period RR following the period SR, by switching the control signals φ3 and φ4 to the high level and the low level, respectively, the column circuit 44 is electrically connected to the reference signal line 53. The column circuit $44_j$ acquires, via the reference signal line 53, a voltage level $V_{dm}$ generated by the dummy cell 49 and corresponding to the reset signal. A signal obtained by subtracting the voltage level $V_{dm}$ from the voltage level $V_{SL1}$ acquired in the period SR is output from the column circuit $44_j$ as the image signal $S_1$ of the pixel cell $20_{1,j}$.

In this example, the feedback reset FBr2 is executed on the pixel cell $20_{1,j}$ in the readout period RR. At this time, the control signals φo2 and φs2 are switched to the high level. The feedback reset FBr2 is executed by continuously or discontinuously varying the feedback control signal $FB_1$ from the high level to the low level so as to pass through an intermediate voltage level.

Additionally, in this example, in the readout period RR of the pixel cell $20_{1,j}$, in parallel with the feedback reset FBr2 of the pixel cell $20_{1,j}$, the feedback reset FBr1 is executed as an electronic shutter on the pixel cell $20_{k,j}$ on the kth row. At this point, the control signal φe2 is switched to the high level, but the first output signal line $30a_j$ and the second output signal line $30b_j$ are in an electrically isolated state. Consequently, like in this example, while executing the feedback reset FBr2 on a certain row, it is possible to execute the feedback reset FBr1 on another row.

Next, the respective graphs on the right side of FIG. 17 will be referenced. Herein, image signal readout from the pixel cell $20_{k,j}$ on the kth row is being executed (period SR). The control for the image signal readout from the pixel cell $20_{k,j}$ on the kth row is mostly similar to the control for the image signal readout from the pixel cell $20_{1,j}$ on the 1st row. In the image signal readout from the pixel cell $20_{k,j}$ on the kth row, by setting the control signals φ2 and φ4 to the high level, the second output signal line $30b_j$ and the column circuit $44_j$ become electrically connected. Also, with the address transistor 14 of the pixel cell $20_{k,j}$ switched on, the control signals φs1 and φe1 are switched to the high level. Consequently, a voltage $V_{SLk}$ corresponding to the voltage of the charge accumulation node FD of the pixel cell $20_{k,j}$ is applied to the column circuit $44_j$.

In the reset signal readout period RR following the period SR, by switching the control signals φ3 and φ4 to the high level and the low level, respectively, the column circuit $44j$ is electrically connected to the reference signal line 53, and a voltage level $V_{dm}$ corresponding to a reset signal from the dummy cell 49 is applied to the column circuit $44_j$. A signal obtained by subtracting the voltage level $V_{dm}$ from the voltage level $V_{SLk}$ acquired in the period SR is output from the column circuit 44 as the image signal $S_k$ of the pixel cell $20_{k,j}$.

Figure 18:
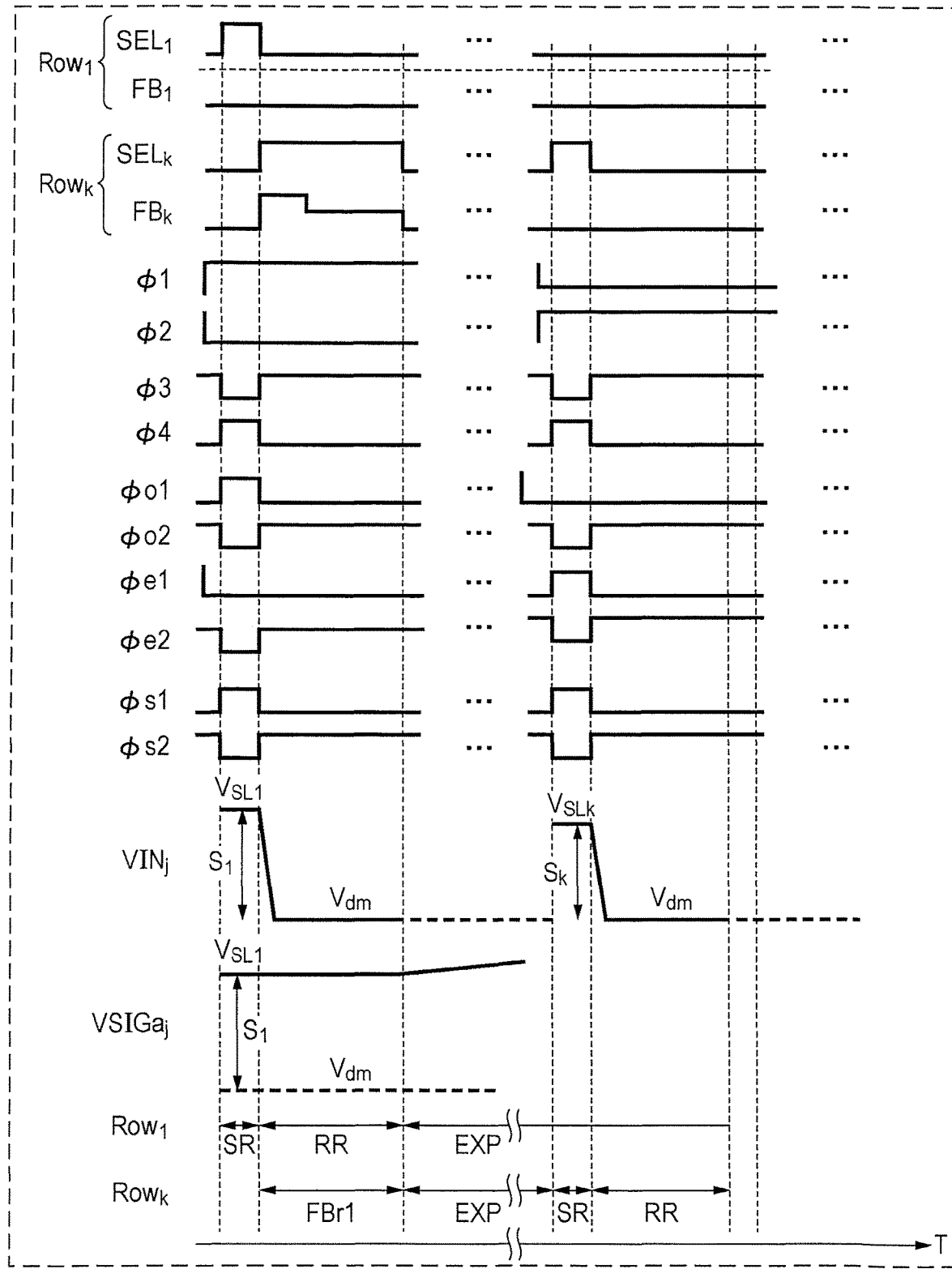
FIG. 18 is a diagram illustrating a typical example of the changes in the control signals for each transistor and each switching element, in the case of applying the second operational example outlined in FIG. 7 to an imaging device.

FIG. 18 illustrates a typical example of the changes in the control signals for each transistor and each switching element, in the case of applying the second operational example outlined in FIG. 7 to the imaging device 400.

The respective graphs on the left side of FIG. 18 will be referenced. Compared to FIG. 17 discussed above, in this example, the feedback reset FBr2 following the period RR on the 1st row is omitted, and the feedback reset FBr1 on the kth row is executed in parallel with the reset signal readout.

The control of each transistor and each switching element for the image signal readout from the pixel cell $20_{1,j}$ on the 1st row may be similar to the control described with reference to FIG. 17. After that, by switching the control signal φ3 to the high level, in the period RR, a voltage level $V_{dm}$ corresponding to a reset signal is applied from the dummy cell 49 to the column circuit 44 via the reference signal line 53.

At this point, if exposure is executed subsequently with the feedback control signal $FB_1$ at the low level, an operation of additionally accumulating signal charge, or in other words non-destructive readout, is possible, as illustrated by the graph of $VSIGa_j$. The control signals φo2 and φs2 may also be set to the low level together with setting the feedback control signal $FB_1$ to the low level.

As illustrated, herein, in the reset signal readout period RR, the feedback reset FBr1 is executed in the pixel cell $20_{k,j}$ on the kth row. The control of each transistor of the pixel cell $20_{k,j}$ in the feedback reset FBr1 on the pixel cell $20_{k,j}$ on the kth row may be similar to the control described with reference to FIG. 17.

Next, the respective graphs on the right side of FIG. 18 will be referenced. The control of each transistor and each switching element for the image signal readout from the pixel cell $20_{k,j}$ on the kth row likewise may be similar to the control described with reference to FIG. 17. Also, the operation during the acquisition of the voltage level $V_{dm}$ corresponding to the reset signal in the period RR is similar to the case of the pixel cell $20_{1,j}$ on the 1st row. Note that in this example, the feedback control signal $FB_k$ is set to the low level in the period RR. In other words, in FIG. 18, control when applying non-destructive readout is illustrated as an example. Note that the applicability of the third operational example in the third embodiment as well is understood easily by persons skilled in the art.

According to the third embodiment, with a feedback reset, the kTC noise produced by the switching off of the feedback transistor $19_{i,j}$ is suppressed by a factor of $(1/(1+D))^{1/2}$ compared to the case of not forming the feedback path. Since the image signal is output to the output signal line (the first output signal line 30a or the second output signal line 30b) at an amplification ratio of approximately 1×, image data with suppressed kTC noise is acquired. Additionally, as described with reference to FIG. 16, by generating a dark level with the dummy cell 49 and computing the difference between the voltage level of the image signal and the dark level, it is possible to suppress a reduction in dynamic range. Note that a reference-signal generator according to the present disclosure is exemplified by the dummy cell 49 in the present embodiment.

(Modifications)

Figure 19:
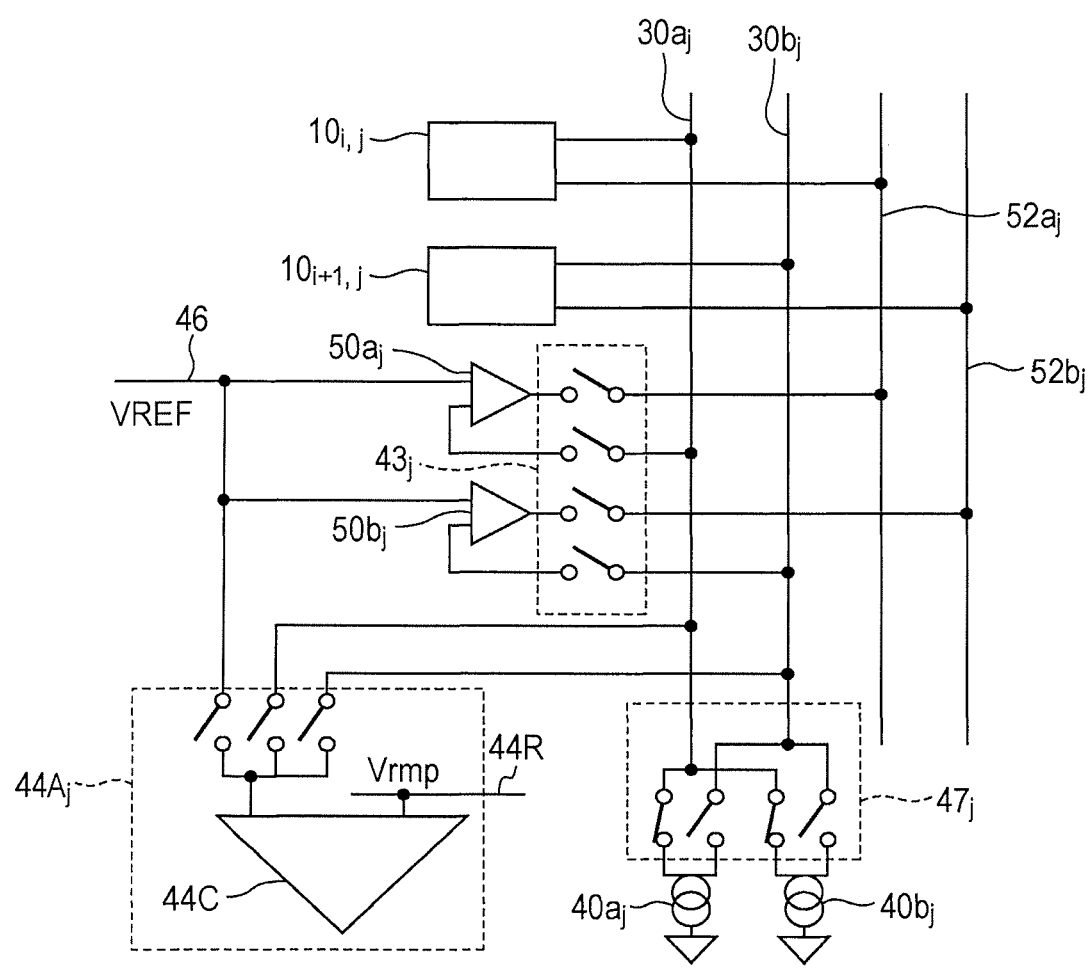
FIG. 19 is a diagram illustrating another example of a readout circuit.

FIG. 19 illustrates another example of a readout circuit. In the configuration illustrated as an example in FIG. 19, a switching circuit $43_j$ is connected between the pair of the first output signal line 30aj and the first feedback line $52a_j$, and the reference voltage line 46, and also between the pair of the second output signal line $30b_j$ and the second feedback line $52b_j$, and the reference voltage line 46. The switching circuit 43j includes multiple switching elements for switching between the formation and dissolution of the first feedback path discussed earlier, and also between the formation and dissolution of the second feedback path. Additionally, the column circuit $44A_j$ in the configuration illustrated as an example in FIG. 19 includes a comparator 44C having a connection to a voltage line 44R that supplies a ramp voltage Vrmp.

As exemplified in FIG. 19, a switching circuit $47_j$ may also be connected between the pair of the first output signal line 30aj and the second output signal line $30b_j$, and the pair of the constant current sources $40a_j$ and $40b_j$. The switching circuit 47j includes one or more switching elements that switch whether to connect the constant current sources $40a_j$ and $40b_j$ to the first output signal line $30a_j$ or the second output signal line $30b_j$.

Figure 20:
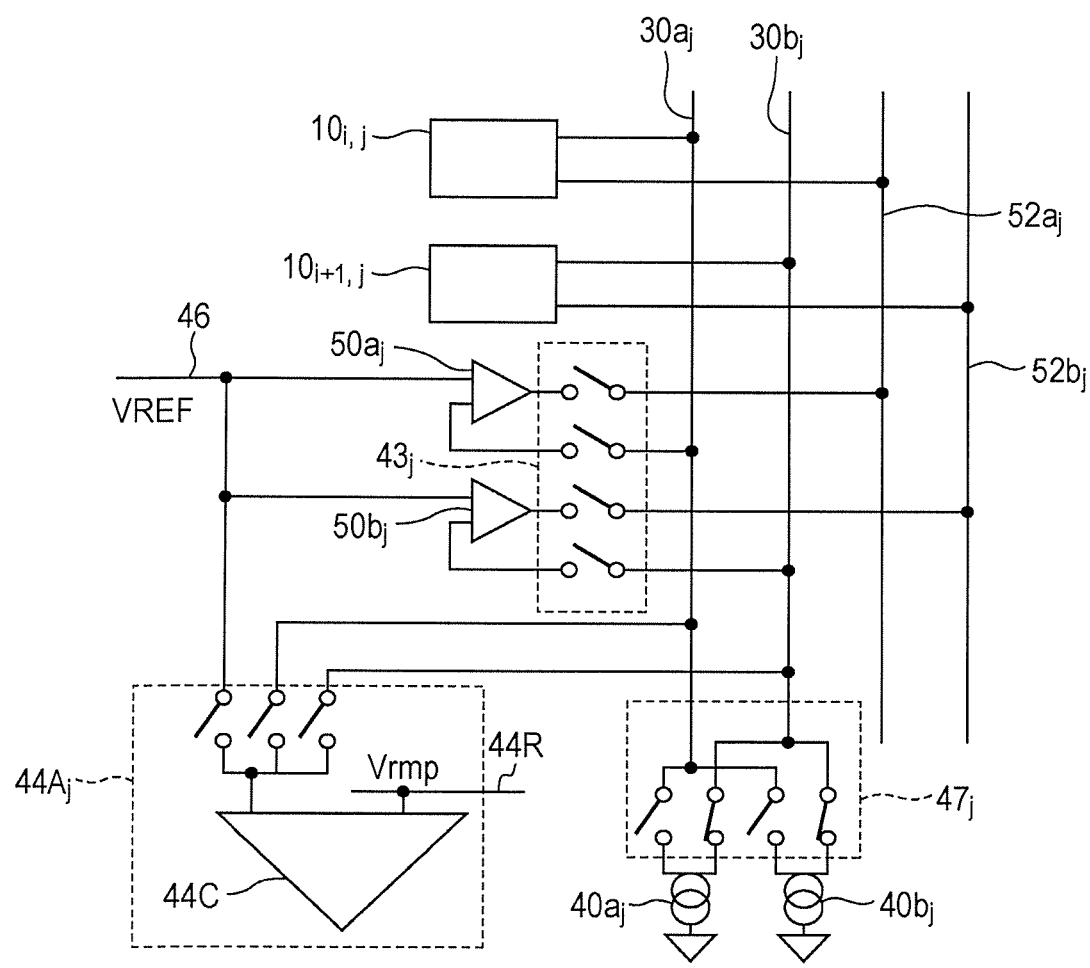
FIG. 20 is a diagram illustrating a state in which the switching circuit connections have been changed in the readout circuit illustrated in FIG. 19.

For example, as illustrated in FIG. 19, by connecting both of the constant current sources $40a_j$ and $40b_j$ to the first output signal line $30a_j$, the amount of current flowing through the first output signal line $30a_j$ may be increased compared to the case of connecting only the constant current source $40a_j$ to the first output signal line $30a_j$. In other words, the signal current may be increased to enable faster signal readout. Similarly, as illustrated in FIG. 20, by connecting both of the constant current sources $40a_j$ and $40b_j$ to the second output signal line $30b_j$, the signal current may be increased compared to the case of connecting only the constant current source $40b_j$ to the second output signal line $30b_j$, thereby increasing the speed of signal readout via the second output signal line $30b_j$.

Figure 21:
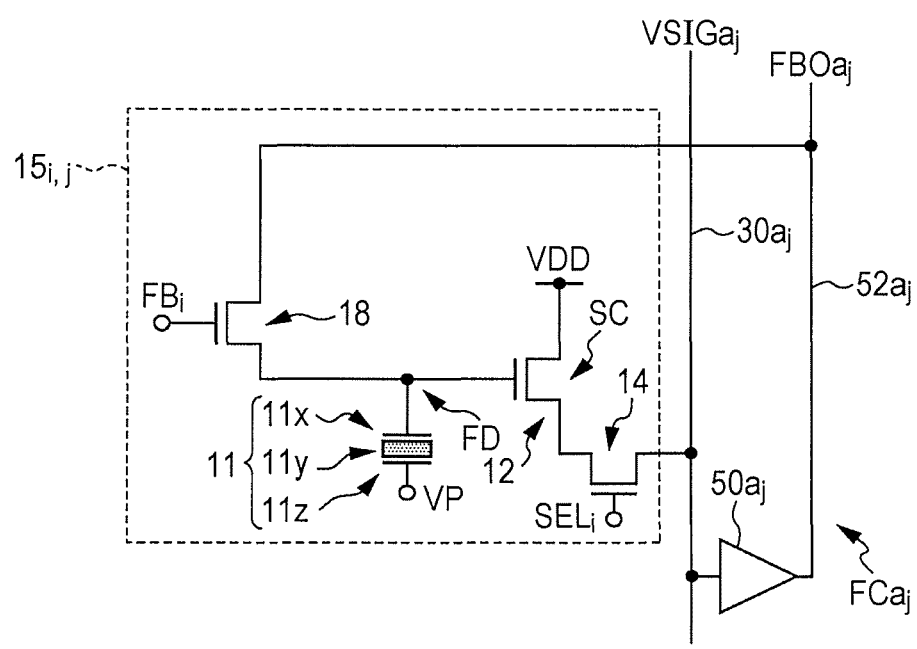
FIG. 21 is a diagram illustrating another example of the circuit configuration of a pixel cell, which is applicable to the first and second embodiments.

FIG. 21 illustrates another example of a circuit configuration of a pixel cell which is applicable to the first and second embodiments. The major difference between the pixel cell $15_{i,j}$ illustrated in FIG. 21 and the pixel cell $10_{i,j}$ described with reference to FIG. 5 is that in the pixel cell $15_{i,j}$, the charge accumulation node FD and the feedback line $52_j$ (in the example illustrated in FIG. 20, the first feedback line $52a_j$) are connected via the feedback transistor 18. The pixel cell 15i,j does not include the reset transistor 16, the first capacitive element 21, and the second capacitive element 22 in the pixel cell $10_{i,j}$ discussed earlier.

A simpler circuit configuration as illustrated in FIG. 21 may also be adopted. The control of the feedback control signal $FB_i$ with respect to the feedback transistor 18 in the pixel cell $15_{i,j}$ may be similar to the control of the feedback control signal $FB_i$ with respect to the feedback transistor $19_{i,j}$ described with reference to FIG. 15. In other words, it is possible to execute the feedback reset discussed earlier by continuously or discontinuously varying the feedback control signal $FB_i$ from the high level to the low level so as to pass through an intermediate voltage level.

Figure 22:
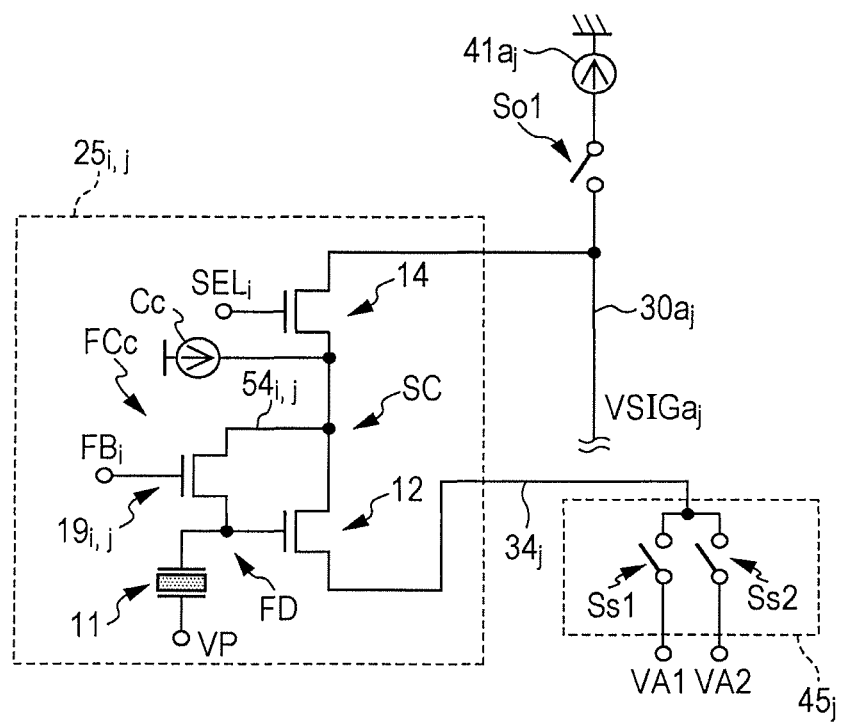
FIG. 22 is a diagram illustrating another example of the circuit configuration of a pixel cell, which is applicable to the third embodiment.

FIG. 22 illustrates another example of a circuit configuration of a pixel cell which is applicable to the third embodiment. The major difference between the pixel cell $25_{i,j}$ illustrated in FIG. 22 and the pixel cell $20_{i,j}$ described with reference to FIG. 15 is that the signal detection circuit SC of the pixel cell $25_{i,j}$ includes a constant current source Cc connected to the node between the address transistor 14 and the signal detection transistor 12.

As exemplified in FIG. 22, by disposing the constant current source Cc inside each pixel cell $25_{i,j}$, it is possible to complete a feedback reset (for example, the feedback reset FBr1 that acts as an electronic shutter) entirely inside the pixel cell $25_{i,j}$. In other words, it is possible to execute a feedback reset without using an output signal line $30_j$ (in the example illustrated in FIG. 22, the first output signal line $30a_j$), and thus noise may be reduced faster. Note that the constant current source Cc may also be shared in common among multiple pixel cells 25. By sharing the constant current source Cc in common among multiple pixel cells 25, the number of elements per cell may be decreased.

Figure 23:
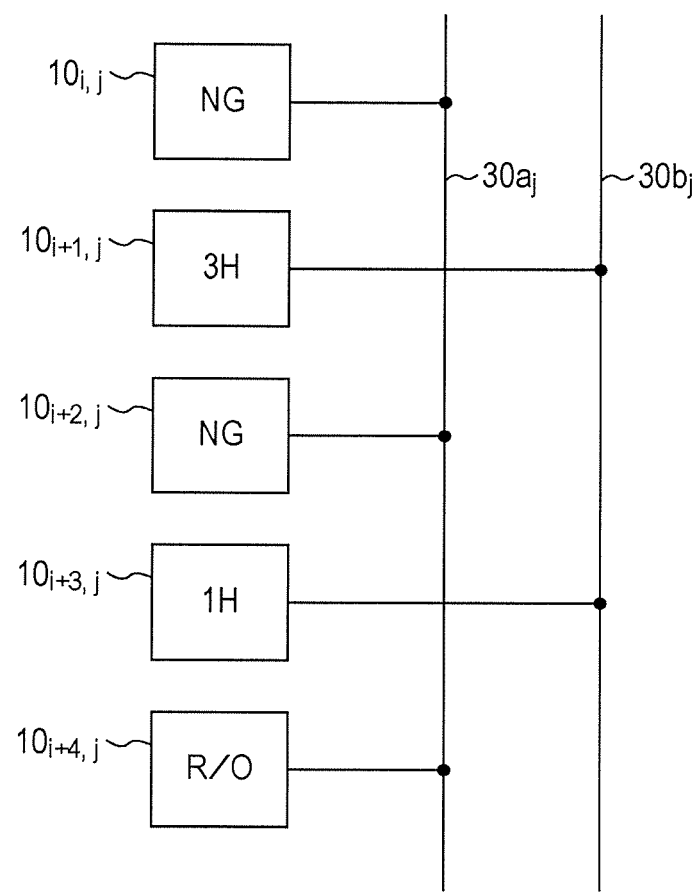
FIG. 23 is a diagram for explaining the effects obtained by alternately arranging, in the column direction on the same column of multiple pixel cells, a pixel cell connected to a first output signal line and a pixel cell connected to a second output signal line.
Figure 24:
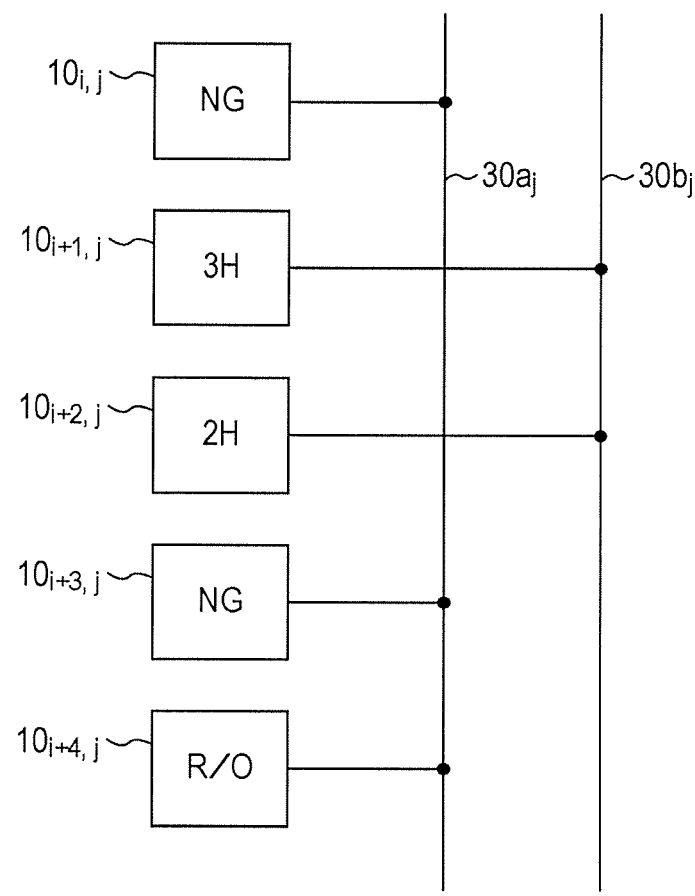
FIG. 24 is a diagram for explaining the effects obtained by alternately arranging, in the column direction on the same column of multiple pixel cells, a pixel cell connected to a first output signal line and a pixel cell connected to a second output signal line.

FIGS. 23 and 24 are diagrams for explaining the effects obtained by alternately arranging, in the column direction on the same column of multiple pixel cells, a pixel cell connected to the first output signal line 30a and a pixel cell connected to the second output signal line 30b.

In the foregoing embodiments, an example is given in which a pixel cell connected to the first output signal line 30a and a pixel cell connected to the second output signal line 30b are arranged alternately in the column direction. However, the arrangement of these two types of pixel cells is not limited to the foregoing example. For example, two or more pixel cells connected to the second output signal line 30b may also be disposed between two pixel cells connected to the first output signal line 30a. As another example, pixel cells connected to the first output signal line 30a and pixel cells connected to the second output signal line 30b may be arranged alternately in units of h rows (where h is an integer equal to or greater than 2). However, arranging a pixel cell connected to the first output signal line 30a and a pixel cell connected to the second output signal line 30b alternately in the column direction may improve the degree of freedom in control of the exposure time for each pixel cell, as described below.

FIG. 23 is a diagrammatic illustration of a configuration in which a pixel cell 10 connected to the first output signal line $30a_j$ and a pixel cell 10 connected to the second output signal line $30b_j$ are arranged alternately in the column direction. On the other hand, FIG. 24 is a diagrammatic illustration of a configuration in which a pixel cell 10 connected to the first output signal line $30a_j$ and a pixel cell 10 connected to the second output signal line $30b_j$ are arranged alternately in units of two rows in the column direction. FIGS. 23 and 24 both illustrate a state of executing signal readout from the pixel cell $10_{i+4,j}$ connected to the first output signal line $30a_j$. At this time, signal readout from the other pixel cells having a connection to the first output signal line $30a_j$ ($10_{i,j}$ and $10_{i+2,j}$ in the configuration of FIG. 23, or $10_{i,j}$ and $10_{i+3,j}$ in the configuration of FIG. 24) is stopped.

As already described, according to an embodiment of the present disclosure, it is possible to execute, in parallel with signal readout from the pixel cell $10_{i+4,j}$ connected to the first output signal line $30a_j$, an electronic shutter on the pixel cells 10 connected to the second output signal line $30b_j$. In the configuration of FIG. 24, the timings of the electronic shutter for the pixel cells 10 connected to the second output signal line $30b_j$ are after a 2H period (pixel cell $10_{i+2,j}$), after a 3H period (pixel cell $10_{i+1,j}$), after a 6H period, after a 7H period, after a 10H period, and after an 11H period from the readout of a signal from the pixel cell $10_{i+4,j}$. Consequently, the configuration of FIG. 24 requires the use of a complicated formula as a general formula to specify a pixel cell on which the electronic shutter may be executed during signal readout from the pixel cell $10_{i+4,j}$, and control of the exposure time becomes complicated. In contrast, with the configuration of FIG. 23, it is possible to use a simpler general formula to specify a pixel cell on which the electronic shutter may be executed during signal readout from the pixel cell $10_{i+4,j}$. Consequently, the degree of freedom in control may be improved. In this way, from the perspective of control of the exposure time, it is desirable to dispose a pixel cell 10 connected to the first output signal line $30a_j$ every other row and dispose a pixel cell 10 connected to the second output signal line $30b_j$ every other row, or in other words, alternately arrange the two types of pixel cells 10 in the column direction.

Also, in the foregoing embodiments, a configuration in which two output signal lines are provided for each column is illustrated as an example. However, the number of output signal lines to provide for each column is not limited to two. For example, in the configuration of Embodiment 1 illustrated in FIG. 1, four output signal lines may be disposed for each column. By taking a configuration in this way, signals may be read out faster. In the following, the description will be reduced or omitted for parts of the configuration shared in common with FIG. 1.

Figure 25:
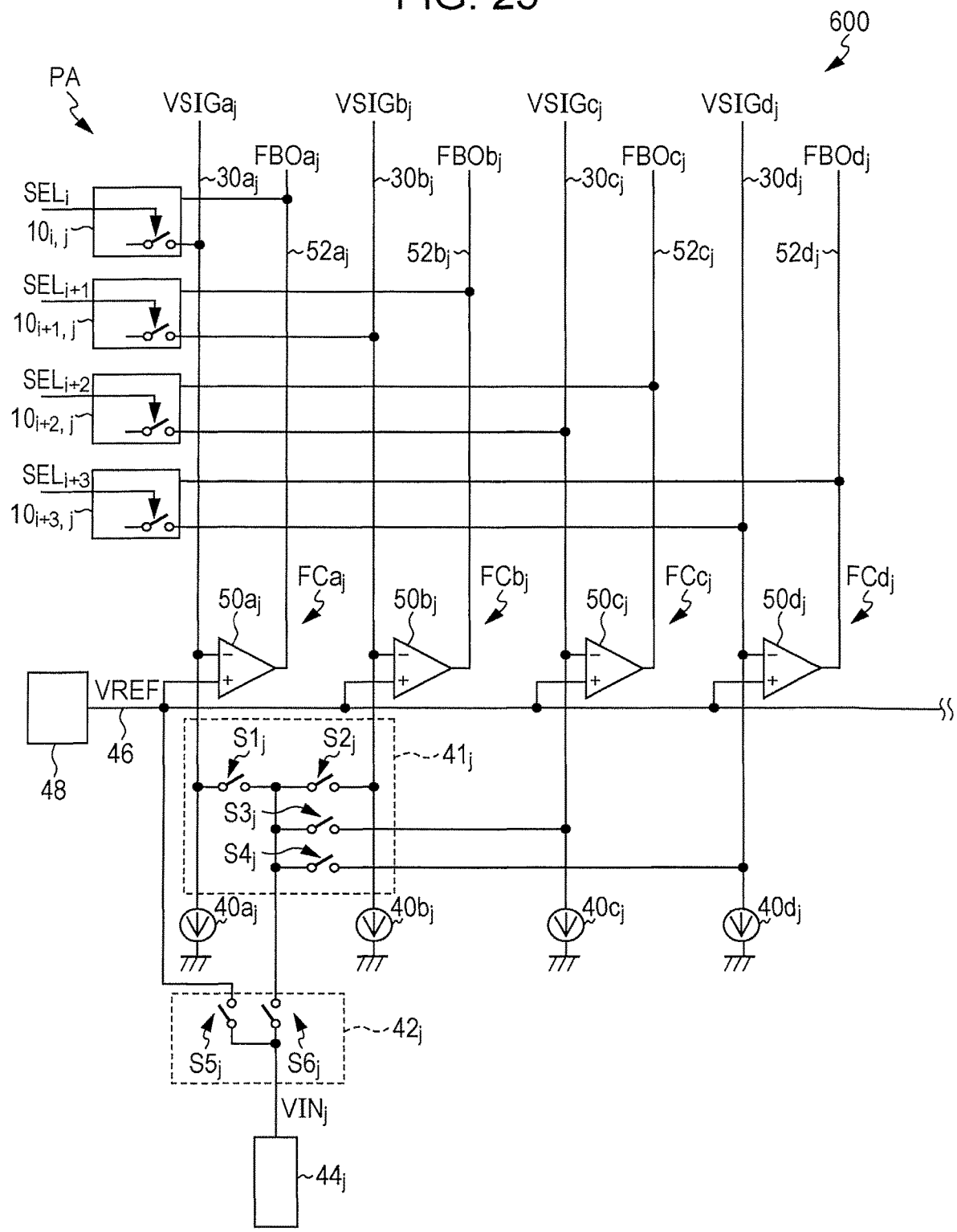
FIG. 25 is a diagram illustrating an overview of an exemplary circuit configuration of an imaging device according to an embodiment provided with four output signal lines for each column.

FIG. 25 illustrates an overview of an exemplary circuit configuration of an embodiment provided with four output signal lines for each column. In FIG. 25, four pixel cells 10 lined up in the column direction are illustrated as a representative example. In the present embodiment, a group of four output signal lines are provided for each column of the pixel cells 10. For example, on the (j)th column of the pixel array PA, a first output signal line $30a_j$, a second output signal line $30b_j$, a third output signal line $30c_j$, and a fourth output signal line $30d_j$ are arranged extending in the column direction. A constant current source made up of a load transistor and the like is connected to one end of each output signal line. In the illustrated example, constant current sources $40a_j$, $40b_j$, $40c_j$, and $40d_j$ are connected respectively to one end of the first output signal line $30a_j$, the second output signal line $30b_j$, the third output signal line $30c_j$, and the fourth output signal line $30d_j$ of the (j)th column.

Each pixel cell 10 has a connection to one from among the first output signal line 30a, the second output signal line 30b, the third output signal line 30c, and the fourth output signal line 30d. In this example, among the multiple pixel cells 10 belonging to the (j)th column, the pixel cell $10_{i,j}$ on the (i)th row is connected to the first output signal line $30a_j$, the pixel cell $10_{i+1,j}$ on the (i+1)th row is connected to the second output signal line $30b_j$, the pixel cell $10_{i+2,j}$ on the (i+2)th row is connected to the third output signal line $30c_j$, and the pixel cell $10_{i+3,j}$ on the (i+3)th row is connected to the fourth output signal line $30d_j$.

The first output signal line 30a, the second output signal line 30b, the third output signal line 30c, and the fourth output signal line 30d for each column of the pixel cells 10 are connected to the switching circuit 41. As illustrated, the switching circuit 41 is connected between the group of the first output signal line 30a, the second output signal line 30b, the third output signal line 30c, and the fourth output signal line 30d, and the column circuit 44 provided in correspondence with each column of the pixel cells 10. A second switching circuit 42 is connected between the switching circuit 41 and the column circuit 44.

The switching circuit 41 includes a first switching element S1 connected to the first output signal line 30a, a second switching element S2 connected to the second output signal line 30b, a third switching element S3 connected to the third output signal line 30c, and a fourth switching element S4 connected to the fourth output signal line 30d. The first switching element S1, the second switching element S2, the third switching element S3, and the fourth switching element S4 are controlled so that one among the four is connected, while the other three are disconnected. Note that in the case of mixing signals from multiple pixel cells, the first switching element S1, the second switching element S2, the third switching element S3, and the fourth switching element S4 may also be controlled so that multiple switching elements among the four are connected at the same time.

The switching circuit 42 includes a fifth switching element S5 and a sixth switching element S6. The sixth switching element S6 is connected between the column circuit 44 and the switching circuit 41. The fifth switching element S5 is connected between the column circuit 44 and the reference voltage line 46. The fifth switching element S5 and the sixth switching element S6 in the second switching circuit 42 are controlled to operate in a complementary manner.

The imaging device 600 includes, for each column of the pixel cells 10, a first feedback circuit FCa, a second feedback circuit FCb, a third feedback circuit FCc, and a fourth feedback circuit FCd. The first feedback circuit FCa, the second feedback circuit FCb, the third feedback circuit FCc, and the fourth feedback circuit FCd include a first inverting amplifier 50a, a second inverting amplifier 50b, a third inverting amplifier 50c, and a fourth inverting amplifier 50d, respectively. As illustrated, the first output signal line 30a is connected to the inverting input terminal of the first inverting amplifier 50a. A first feedback line 52a is connected to the output terminal of the first inverting amplifier 50a. The pixel cells 10 having a connection to the first output signal line 30a are connected to the first feedback line 52a. The inverting input terminal of the second inverting amplifier 50b is connected to the second output signal line 30b. A second feedback line 52b is connected to the output terminal of the second inverting amplifier 50b, and the pixel cells 10 having a connection to the second output signal line 30b are connected to the second feedback line 52b. The inverting input terminal of the third inverting amplifier 50c is connected to the third output signal line 30c. A third feedback line 52c is connected to the output terminal of the third inverting amplifier 50c, and the pixel cells 10 having a connection to the third output signal line 30c are connected to the third feedback line 52c. The inverting input terminal of the fourth inverting amplifier 50d is connected to the fourth output signal line 30d. A fourth feedback line 52d is connected to the output terminal of the fourth inverting amplifier 50d, and the pixel cells 10 having a connection to the fourth output signal line 30d are connected to the fourth feedback line 52d. The non-inverting input terminals of the first inverting amplifier 50a, the second inverting amplifier 50b, the third inverting amplifier 50c, and the fourth inverting amplifier 50d are all connected to the reference voltage line 46.

According to the imaging device 600 configured as above, signal readout and feedback reset may be performed in parallel among pixel cells 10 respectively connected to each of the first output signal line 30a, the second output signal line 30b, the third output signal line 30c, and the fourth output signal line 30d. Specifically, for example, in parallel with performing signal readout for one pixel cell 10, a feedback reset may be performed for three other pixel cells 10. Consequently, it is possible to read out signals for forming the image of one frame faster while also reducing the influence of noise, and a high frame rate may be realized.

In FIG. 25, a configuration that includes four output signal lines for each column and has the feedback circuit of Embodiment 1 illustrated in FIG. 1 as an example is described. Similar modifications are also possible for other feedback circuits of the foregoing embodiments. For example, in the case of the configuration illustrated in FIG. 13, it is sufficient to add an output signal line 30, a feedback line 52, and a constant current source 40 in correspondence with each of the pixel cell $10_{i+2,j}$ and the pixel cell $10_{i+3,j}$. Furthermore, it is sufficient to increase the number of switching elements in the switching circuit 41 and the switching circuit 43 according to the number of output signal lines 30 and feedback lines 52. Note that the inverting amplifier 50j may be shared among four pixel cells, or another inverting amplifier 50j may be added for use with the pixel cell $10_{i+2,j}$ and the pixel cell $10_{i+3,j}$.

As another example, in the case of the configuration illustrated in FIG. 15, it is sufficient to add an output signal line 30, a column circuit 44 connected to the output signal line 30, and respective constant current sources 41 and 42 in correspondence with each of the pixel cell $20_{i+2,j}$ and the pixel cell $20_{i+3,j}$. Note that the power supply line $34_j$ and the switching circuit $45_j$ may be shared among four pixel cells, or another group of a power supply line 34j and a switching circuit 45j may be added for use with the pixel cell $20_{i+2,j}$ and the pixel cell $20_{i+3,j}$.

As another example, in the case of the configuration illustrated in FIG. 16, it is sufficient to add an output signal line 30, a column circuit 44 connected to the output signal line 30, and respective constant current sources 41 and 42 in correspondence with each of the pixel cell $20_{i+2,j}$ and the pixel cell $20_{i+3,j}$. Furthermore, it is sufficient to increase the number of switching elements in the switching circuit 41 according to the number of output signal lines 30. Note that the power supply line $34_j$ and the switching circuit $45_j$ may be shared among four pixel cells, or another group of a power supply line 34j and a switching circuit 45j may be added for use with the pixel cell $20_{i+2,j}$ and the pixel cell $20_{i+3,j}$.

As described above, in the case of increasing the number of output signal lines provided for each column, it is sufficient to add vertical signal lines, feedback lines, or switching elements in the switching circuit, depending on the circuit configuration. In other words, the circuit configurations of the foregoing embodiments, such as those illustrated in FIGS. 1, 13, 15, and 16, may still be used even in the case of providing three or more output signal lines for each column.

Note that even in the case of providing three or more output signal lines for each column, it is desirable to arrange periodically, in the column direction, the pixel cells connected to each output signal line. For example, in the case of providing four output signal lines for each column, it is desirable to arrange a first pixel cell connected to the first output signal line every four rows, and arrange a second pixel cell connected to the second output signal line every four rows. Additionally, it is desirable furthermore to arrange a third pixel cell connected to the third output signal line every four rows, and arrange a fourth pixel cell connected to the fourth output signal line every four rows. By arranging the pixel cells in this way, it becomes possible to use a simple general formula to specify imaging cells on rows on which the electronic shutter can be executed when readout from a pixel cell on a certain row is executed.

Figure 26:
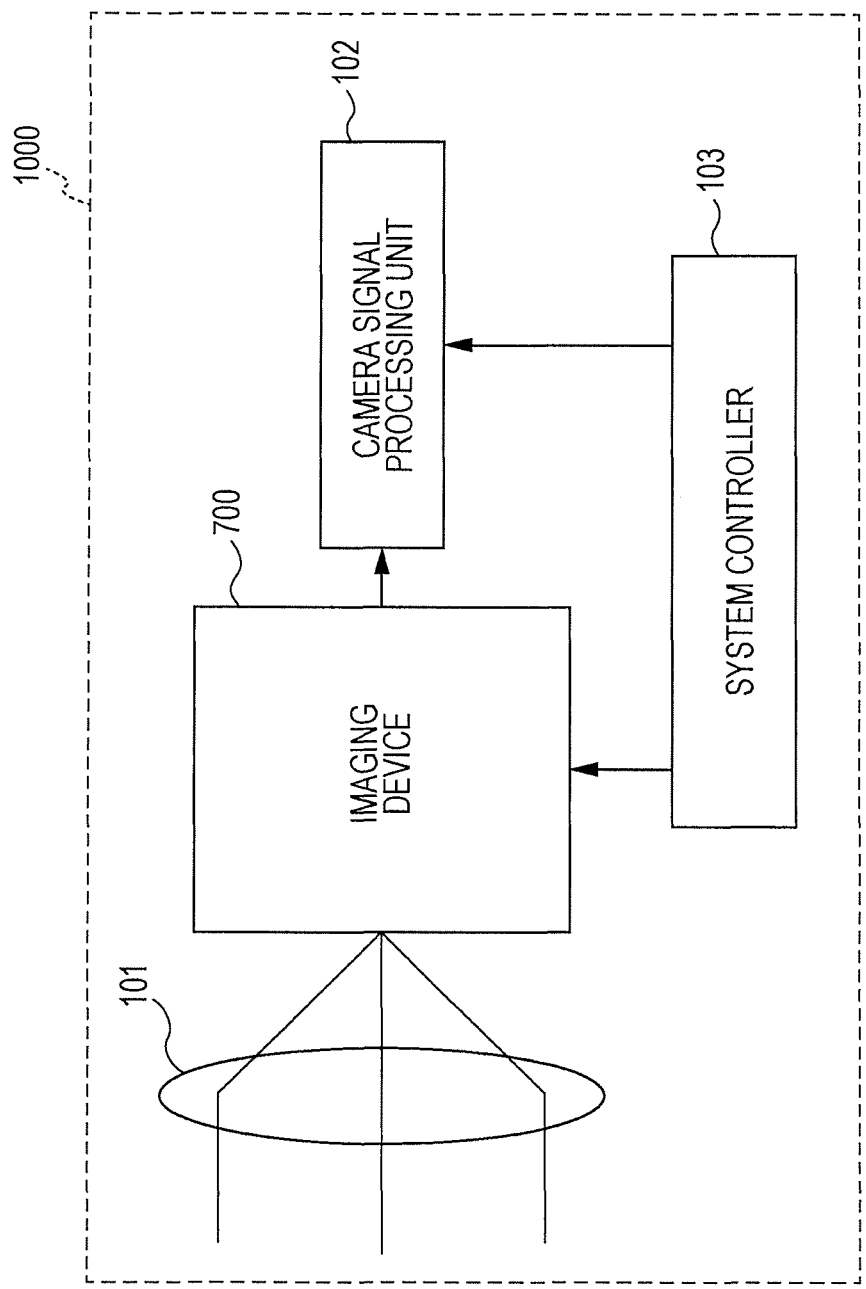
FIG. 26 is a block diagram illustrating an example configuration of a camera system including an imaging device according to an embodiment of the present disclosure.

FIG. 26 illustrates an example configuration of a camera system including an imaging device according to an embodiment of the present disclosure. The camera system 1000 illustrated in FIG. 26 includes a lens optical system 101, an imaging device 700, a camera signal processing unit 102, and a system controller 103. For the imaging device 700, any of the imaging devices 100 to 400 and 600 discussed earlier may be applied.

The lens optical system 101 includes an autofocus lens, a zoom lens, and a diaphragm, for example. The lens optical system 101 focuses light onto the imaging surface of the imaging device 700. The camera signal processing unit 102 functions as a signal processing circuit that processes an output signal from the imaging device 700. The camera signal processing unit 102 executes processing such as gamma correction, color interpolation processing, spatial interpolation processing, and auto white balance, for example, and outputs image data (or a signal). The camera signal processing unit 102 may be realized by a component such as a digital signal processor (DSP), for example. The system controller 103 controls the camera system 1000 as a whole. The system controller 103 may be realized by a microprocessor, for example. By applying one of the foregoing embodiments as the imaging device 700, it is possible to achieve both noise reduction and fast signal readout.

As discussed above, according to an embodiment of the present disclosure, it is possible to achieve both noise reduction and fast signal readout. An embodiment of the present disclosure is useful particularly in a laminated imaging device for which a technique of providing a transfer transistor inside the pixel cells and applying correlated double sampling is typically difficult to apply simply. Also, according to an embodiment of the present disclosure, non-destructive readout is also possible in which a signal generated by a photoelectric converter is read out continuously while maintaining the amount of signal charge accumulated in the charge accumulation node FD. Non-destructive readout is useful for sensing, and is useful in applications such as drones (such as unmanned wheeled vehicles, unmanned aircraft, or unmanned marine vessels), robots, factory automation (FA), and motion capture, for example.

Note that each of the signal detection transistor 12, the address transistor 14, the reset transistor 16, the feedback transistors 18 and 19, the first dummy transistor 12d, the second dummy transistor 14d, and the third dummy transistor 19d discussed above may be an n-channel MOSFET or a p-channel MOSFET. It is not necessary for all of the above to be n-channel MOSFETs or p-channel MOSFETs uniformly. Besides FETs, bipolar transistors may also be used as the transistors.

An imaging device according to the present disclosure is useful in apparatus such as image sensors and digital cameras, for example. An imaging device of the present disclosure may be used in apparatus such as a medical camera, a robot camera, a security camera, or a camera used onboard a vehicle.

What is claimed is:

1. An imaging device, comprising:
    pixels arranged in a matrix having rows and columns, the pixels including first pixels and second pixels different from the first pixels, the first pixels and the second pixels being located in one of the columns, each of the pixels comprising:
        a photoelectric converter that converts incident light into signal charge, and
        a first transistor having a first gate, a first source and a first drain, the first gate being coupled to the photoelectric converter,
    a first line coupled to one of the first source and the first drain of each of the first pixels;
    a second line coupled to one of the first source and the first drain of each of the second pixels, the second line being different from the first line;
    a third line coupled to the other of the first source and the first drain of each of the first pixels;
    voltage circuitry that is coupled to the third line and that supplies a first voltage and a second voltage different from the first voltage in a period in which the imaging device acquires an image data of an object,
    wherein the first pixels are arranged every n rows in the one of the columns, and the second pixels are arranged every n rows in the one of the columns, where n is an integer equal to or greater than two, the rows respectively having the first pixels being different from those respectively having the second pixels.

2. The imaging device according to claim 1, wherein
    the photoelectric converter includes a pixel electrode, a counter electrode, and a photoelectric conversion layer located between the pixel electrode and the counter electrode, and
    the pixel electrode is coupled to the first gate.

3. The imaging device according to claim 1, wherein
    each of the pixels further comprises a second transistor,
    the second transistor of each of the first pixels is coupled between the first line and the one of the first source and the first drain of corresponding one of the first pixels; and
    the second transistor of each of the second pixels is coupled between the second line and the one of the first source and the first drain of corresponding one of the second pixels.

4. The imaging device according to claim 1, further comprising:
    column circuitry that accepts output signals from the first pixels and the second pixels; and
    switching circuitry that is coupled between the first line and the column circuitry and that is coupled between the second line and the column circuitry, the switching circuitry electrically coupling either the first line or the second line to the column circuitry.

5. The imaging device according to claim 1, wherein
    the pixels further includes third pixels and fourth pixels in the one of the columns, the third pixels being different from the first and second pixels, the fourth pixels being different from the first to third pixels,
    the imaging device further comprising:
    a fourth line coupled to one of the first source and the first drain of each of the third pixels, the fourth line being different from the first and second lines; and
    a fifth line coupled to one of the first source and the first drain of each of the fourth pixels, the fifth line being different from the first to fourth lines, and
    the first pixels are arranged every 4 rows in the one of the columns, and the second pixels are arranged every 4 rows in the one of the columns.

6. The imaging device according to claim 5, wherein the third pixels are arranged every 4 rows in the one of the columns, and the fourth pixels are arranged every 4 rows in the one of the columns, the rows respectively having the first pixels, the rows respectively having the second pixels, the rows respectively having the third pixels and the rows respectively having the fourth pixels being different from one another.

7. The imaging device according to claim 1, wherein each of the pixels includes a second transistor having a second gate, a second source and a second drain, either the first source or the first drain being configured to electrically couple to the photoelectric converter via the second transistor.

8. The imaging device according to claim 1, wherein the voltage circuitry supplies only the first voltage and the second voltage.

9. The imaging device according to claim 1, further comprising
    a first current source that is coupled to the first line; and
    a second current source that is different from the first current source and that is coupled to the one of the first source and the first drain of at least one of the first pixels.

10. The imaging device according to claim 1, wherein the voltage circuitry is configured to supply the first voltage in a first period and the second voltage in a second period, the first period and the second period being different from each other and included in a same frame period.

11. An imaging device, comprising:
a first pixel and a second pixel different from the first pixel, the first pixel and the second pixel being located in the same column, each of the first pixel and the second pixel comprising:
a photoelectric converter that converts incident light into signal charge, and
a first transistor having a first gate, a first source and a first drain, the first gate being coupled to the photoelectric converter;
a first line coupled to one of the first source and the first drain of the first pixel;
a second line coupled to one of the first source and the first drain of the second pixel, the second line being different from the first line;
voltage circuitry that is configured to supply a first voltage and a second voltage different from the first voltage to the other of the first source and the first drain of each of the first pixel and the second pixel in a period in which the imaging device acquires an image data of an object.

12. The imaging device according to claim 11, further comprising:
a third line that is coupled to the other of the first source and the first drain of each of the first pixel and the second pixel, the voltage circuitry being coupled to the other of the first source and the first drain of each of the first pixel and the second pixel via the third line.

13. The imaging device according to claim 11, wherein
the photoelectric converter includes a pixel electrode, a counter electrode, and a photoelectric conversion layer located between the pixel electrode and the counter electrode, and
the pixel electrode is coupled to the first gate.

14. The imaging device according to claim 11, wherein
each of the first pixel and the second pixel further comprises a second transistor,
the second transistor of the first pixel is coupled between the first line and the one of the first source and the first drain of the first pixel; and
the second transistor of the second pixel is coupled between the second line and the one of the first source and the first drain of the second pixel.

15. The imaging device according to claim 11, wherein each of the first pixel and the second pixel includes a second transistor having a second gate, a second source and a second drain, either the first source or the first drain being configured to electrically couple to the photoelectric converter via the second transistor.

16. The imaging device according to claim 11, wherein the voltage circuitry supplies only the first voltage and the second voltage.

17. The imaging device according to claim 11, further comprising
a first current source that is coupled to the first line; and
a second current source that is different from the first current source and that is coupled to the one of the first source and the first drain of the first pixel.

18. An imaging device, comprising:
a first pixel and a second pixel different from the first pixel, the first pixel and the second pixel being located in the same column, each of the first pixel and the second pixel comprising:
a photoelectric converter that converts incident light into signal charge, and
a first transistor having a first gate, a first source and a first drain, the first gate being coupled to the photoelectric converter;
a first line coupled to one of the first source and the first drain of the first pixel;
a second line coupled to one of the first source and the first drain of the second pixel, the second line being different from the first line;
first voltage circuitry that is configured to supply a first voltage and a second voltage different from the first voltage to the other of the first source and the first drain of the first pixel in a period in which the imaging device acquires an image data of an object,
second voltage circuitry that is configured to supply the first voltage and the second voltage to the other of the first source and the first drain of the second pixel in a period in which the imaging device acquires an image data of an object.

19. The imaging device according to claim 18, further comprising:
a third line coupled to the other of the first source and the first drain of the first pixel, the first voltage circuitry being coupled to the other of the first source and the first drain of the first pixel via the third line, and
a fourth line coupled to the other of the first source and the first drain of the second pixel, the second voltage circuitry being coupled to the other of the first source and the first drain of the second pixel via the fourth line.

20. The imaging device according to claim 18, wherein
the photoelectric converter includes a pixel electrode, a counter electrode, and a photoelectric conversion layer located between the pixel electrode and the counter electrode, and
the pixel electrode is coupled to the first gate.

21. The imaging device according to claim 18, wherein
each of the first pixel and the second pixel further comprises a second transistor,
the second transistor of the first pixel is coupled between the first line and the one of the first source and the first drain of the first pixel; and
the second transistor of the second pixel is coupled between the second line and the one of the first source and the first drain of the second pixel.

22. The imaging device according to claim 18, wherein each of the first pixel and the second pixel includes a second transistor having a second gate, a second source and a second drain, either the first source or the first drain being configured to electrically couple to the photoelectric converter via the second transistor.

23. The imaging device according to claim 18, wherein
the first voltage circuitry supplies only the first voltage and the second voltage, and
the second voltage circuitry supplies only the first voltage and the second voltage.

24. The imaging device according to claim 18, further comprising
a first current source that is coupled to the first line; and
a second current source that is different from the first current source and that is coupled to the one of the first source and the first drain of the first pixel.

* * * * *